(12) United States Patent
Gravina

(10) Patent No.: US 10,020,436 B1
(45) Date of Patent: Jul. 10, 2018

(54) THERMAL ENERGY ACCUMULATOR FOR POWER GENERATION AND HIGH PERFORMANCE COMPUTING CENTER

(71) Applicant: Matteo B. Gravina, Laredo, TX (US)

(72) Inventor: Matteo B. Gravina, Laredo, TX (US)

( * ) Notice: Subject to any disclaimer, the term of this patent is extended or adjusted under 35 U.S.C. 154(b) by 0 days.

(21) Appl. No.: 15/623,473

(22) Filed: Jun. 15, 2017

(51) Int. Cl.
*H01L 35/30* (2006.01)
*H05K 7/20* (2006.01)
*H05K 7/14* (2006.01)
*H02N 11/00* (2006.01)
*H01L 35/34* (2006.01)
*H01L 35/00* (2006.01)
*H01L 35/32* (2006.01)

(52) U.S. Cl.
CPC .......... *H01L 35/30* (2013.01); *H05K 7/1492* (2013.01); *H05K 7/20736* (2013.01); *H01L 35/00* (2013.01); *H01L 35/32* (2013.01); *H01L 35/34* (2013.01); *H02N 11/008* (2013.01); Y10S 74/09 (2013.01)

(58) Field of Classification Search
CPC ......... H01L 35/00; H01L 35/30; H01L 35/32; H01L 35/34; H05K 7/1492; H05K 7/20736; H02N 11/008; Y10S 74/09
See application file for complete search history.

(56) References Cited

U.S. PATENT DOCUMENTS

| 5,269,146 | A  | 12/1993 | Kerner |
| 6,166,317 | A  | 12/2000 | Volk, Jr. |
| 6,516,954 | B2 | 2/2003  | Broome |
| 6,574,970 | B2 | 6/2003  | Spinazzola et al. |
| 6,594,148 | B1 | 7/2003  | Nguyen et al. |
| 6,672,955 | B2 | 1/2004  | Charron |
| 6,836,030 | B2 | 12/2004 | Smith et al. |
| 6,912,131 | B2 | 6/2005  | Kabat |
| 7,086,823 | B2 | 8/2006  | Michaud |
| 7,088,583 | B2 | 8/2006  | Brandon et al. |
| 7,184,267 | B2 | 2/2007  | Patel |
| 7,286,345 | B2 | 10/2007 | Casebolt |
| 7,508,663 | B2 | 3/2009  | Coglitore |
| 7,534,167 | B2 | 5/2009  | Day |
| 7,752,858 | B2 | 7/2010  | Johnson et al. |
| 7,869,209 | B2 | 1/2011  | Nemoz et al. |
| 7,900,450 | B2 | 3/2011  | Gurin |
| 7,952,869 | B2 | 5/2011  | Lewis, II et al. |

(Continued)

FOREIGN PATENT DOCUMENTS

CA    2635304 A1    1/2010

OTHER PUBLICATIONS

Panduit, Panduit Corporation, "Net-SERV® Vertical Exhaust Ducts (VED)", Specification Sheet, www.panduit.com, 2012.

(Continued)

*Primary Examiner* — Matthew T Martin
(74) *Attorney, Agent, or Firm* — Donald J. Ersler

(57) ABSTRACT

A thermal energy accumulator for power generation and high performance computing center utilizes heat generated by at least one of a transformer, a parking lot, a roof structure, an air conditioner, a generator, an uninterruptible power supply, a thermal energy conveyer and a thermal energy converter; a source of cold condensed compressed air; and at least one of a thermoelectric generator and a thermoelectric gradient inducer to generate electrical power for a performance computing center.

12 Claims, 20 Drawing Sheets

(56) References Cited

U.S. PATENT DOCUMENTS

| | | | |
|---|---|---|---|
| 7,984,613 B2 | 7/2011 | DuBois | |
| 8,040,673 B2 | 10/2011 | Krietzman | |
| 8,064,200 B1 | 11/2011 | West et al. | |
| 8,154,870 B1 | 4/2012 | Czamara et al. | |
| 8,248,801 B2 | 8/2012 | Campbell et al. | |
| 8,254,120 B2 | 8/2012 | Hasse et al. | |
| 8,300,402 B2 | 10/2012 | Wei | |
| 8,331,087 B2 | 12/2012 | Wei | |
| 8,405,985 B1 | 3/2013 | Reynov et al. | |
| 8,425,287 B2 | 4/2013 | Wexler | |
| 8,456,839 B2 | 6/2013 | Shirakami et al. | |
| 8,472,181 B2 | 6/2013 | Doll | |
| 8,490,397 B2 | 7/2013 | Lehar | |
| 8,522,552 B2 | 9/2013 | Waterstripe et al. | |
| 8,522,569 B2 | 9/2013 | Avery et al. | |
| 8,592,671 B2 | 11/2013 | Chang et al. | |
| 8,640,461 B2 | 2/2014 | Thompson | |
| 8,733,103 B2 | 5/2014 | Paya Diaz | |
| 8,867,204 B1 | 10/2014 | Gardner | |
| 8,922,992 B2 | 12/2014 | Shah et al. | |
| 9,072,195 B2 | 6/2015 | Kameno et al. | |
| 9,084,369 B2 | 7/2015 | Lewis, II et al. | |
| 9,141,156 B2 | 9/2015 | Ross et al. | |
| 9,167,724 B1 | 10/2015 | Somani et al. | |
| 9,204,576 B2 | 12/2015 | Goulden et al. | |
| 9,215,831 B2 | 12/2015 | Hao et al. | |
| 9,318,682 B2 | 4/2016 | Lorimer et al. | |
| 2007/0074525 A1 | 4/2007 | Vinson et al. | |
| 2008/0083446 A1* | 4/2008 | Chakraborty | H01L 35/00 136/205 |
| 2009/0061755 A1 | 3/2009 | Calder et al. | |
| 2010/0024445 A1 | 2/2010 | Cichanowicz | |
| 2011/0056660 A1 | 3/2011 | Aybay et al. | |
| 2011/0138708 A1 | 6/2011 | Chazelle et al. | |
| 2011/0239683 A1 | 10/2011 | Czamara et al. | |
| 2012/0075794 A1 | 3/2012 | Wei et al. | |
| 2014/0014153 A1* | 1/2014 | Onose | H01L 35/30 136/205 |
| 2014/0185225 A1 | 7/2014 | Wineland | |
| 2016/0099398 A1 | 4/2016 | Lorimer et al. | |
| 2016/0155921 A1* | 6/2016 | Jeon | H01L 35/30 320/101 |

OTHER PUBLICATIONS

Chatsworth Products, Inc., "Ducted Exhaust Cabinet ~ Managing Exhaust Airflow Beyond Hot Aisle/Cold Aisle", Cabinets: Thermal Management, White Paper, www.chatsworth.com, 2009.

"Elsevier Journal, ""Energy Conversion and Management"", Thermodynamic feasibility of harvesting data center waste heat to drivean absorption chiller, Anna Haywood, Jon Sherbeck, Patrick Phelan, Georgios Varsampoulos, Sandeep K.S.Gupta, www.elsevier.com/locate/enconman, 2012".

Chatsworth Products, Inc., "CPI Passive Cooling® Solutions: A Path to Higher Density and Lower Cost", CPI Thermal Management, White Paper, Ian Seaton, www.chatsworth.com, 2009.

Jeffrey J. Sircuranza, Applied Methodologies, Inc., "The Case for Thermoelectrics in the Data Center", A new approach and use of an old science, AMILBAS Research, 2009.

Pentair, Pentair Technical Products, "Overview & Design of Data Center Products:" www.pentairtechnicalproducts.com, 2010.

Neil Rasmussen, Schneider Electric, APC, "Air Distribution Architecture Options for Mission Critical Facilities", White Paper #55, www.apc.com, 2003.

Fortum, "Data Center Cooling with Heat Recovery, Cost efficient and sustainable data center cooling," 2017.

Shehabi, A., Smith, S.J., Horner, N., Azevedo, I., Brown, R., Koomey, J., Masanet, E., Sartor, D., Herrlin, M., Lintner, W. "United States Data Center Energy Usage Report" Lawrence Berkeley National Laboratory, Berkeley, California. LBNL-1005775, 2016.

Emerson Network Power, "Smart Cooling Solutions Data Center, Solutions for a Future-proof Data Center," Oct. 2012.

J.-P. Fleurial, P. Gogna, B.C.-Y. Li, S. Firdosy, B.J. Chen, C.-K. Huang, V. Ravi1, T. Caillat, K. Star, University of California at Los Angeles, CA, USA, California State Polytechnic University, Panoma, CA, USA, Jet Propulsion Laboratory/California Institute of Technology, Pasadena, CA, USA, "Waste Heat Recovery Opportunities for Thermoelectric Generators," 2009 Thermoelectric Applications Workshop, Sep. 2009.

Lewis III, Lawrence, Rensselaer Polytechnic Institute, "Investigating of Waste Heat Recovery in Data Centers by the Thermoelectric Effect," Hartford, Connecticut, Apr. 2012.

Darrow, Ken., Hedman, Bruce., ICF International, "Opportunities for Combined Heat and Power in Data Centers," Mar. 2009.

Campbell, Bradford., Ghena, Branden., Dutta, Prabal., "Energy-Harvesting Thermoelectric Sensing for Unobtrusive Water and Appliance Metering," University of Michigan, Nov. 2014.

Mahdavi, Rod, "Liquid Cooling v. Air Cooling Evaluation in the Maui High Performance Computer Center," Lawrence Berkeley National Laboratory, Federal Energy Management Program, U.S. Department of Energy, Jul. 2014.

Coghlan, Susan, "CORAL: the Nation's Leadership Computers for Open Science from 2017 through 2022 and beyond," Argonne National Laboratory 2015.

Kamil, Shoaib, Shalf, John, Strohmaier, Erich, "Power Efficiency in High Performance Computing," Lawrence Berkeley National Laboratory, 2008.

Dosanjh, Sudip, "ASCR Facility Plans," Office of Science, U.S. Department of Energy, 2015.

Intel Corporation, "Aurora Fact Sheet,".

Wells, Jack, "ORNL OLCF Facilities Plans," HEP-ASCR Requirements Workshop, Oak Ridge National Laboratory, 2015.

www.alphabetenergy.com/product/e1-c/.
www.alphabetenergy.com/product/e1/.
www.alphabetenergy.com/product/powermodule-dev-kit/.
www.alphabetenergy.com/product/powermodule/.

* cited by examiner

103

100

101   102

Thermal Energy Conveyer
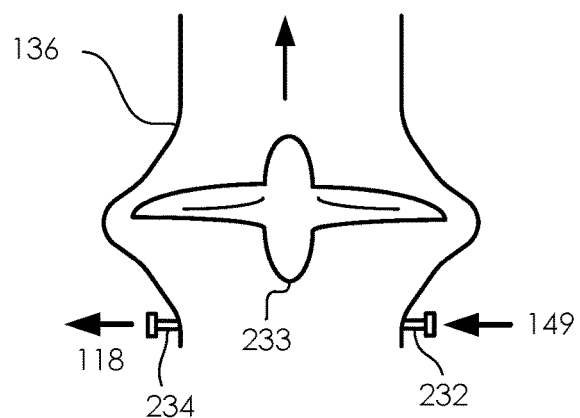
FIG. 15g
Thermal Energy Converter
FIG. 15h
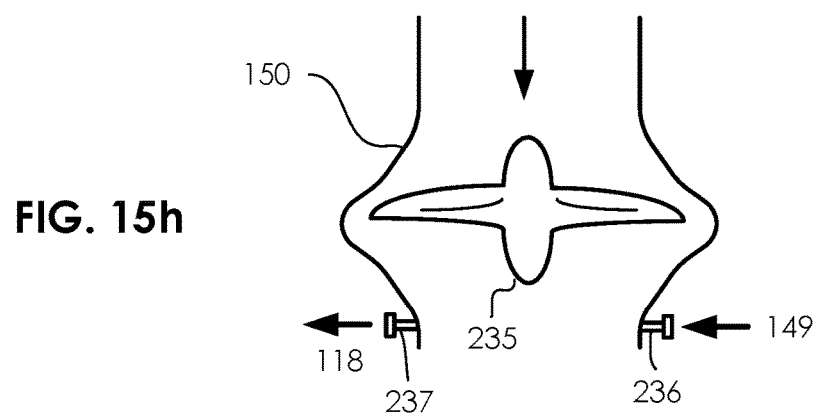

THERMAL ENERGY ACCUMULATOR FOR POWER GENERATION AND HIGH PERFORMANCE COMPUTING CENTER

BACKGROUND OF THE INVENTION

1. Field of the Invention

The present invention relates generally to electrical power generation and more specifically to thermal energy accumulator for power generation and high performance computing center, which utilizes heat generated by various devices for the generation of electrical power for performance computing centers.

2. Discussion of the Prior Art

The advent of the computer desktop brought about opportunities and freedoms as well latitude in personal and work time. During the decade of the eighties and nineties, the exponential growth of desktops started to acclaim to everyday life. Education started to use computers for teaching on hardware and software while in the business world computers started to appear to increase productivity. As computers became the norm in everyday life, they started to get more sophisticated which lead to the next step in computer technology, network connectivity.

As a result of the computer network, the logarithmic growth allow society to have freedoms and receive a better quality of life. The next step in computer technology was the interconnection of networks; as a result, the internet came into play. Now with the internet, networks could connect via new software and hardware technologies. The next step brought upon the spread of the internet was the data center, which nowadays is the where most of the information and data that is the internet resides. Broadband, Wi-Fi and cellular technology now allows mobile users to move about and request data from these data centers, which in kind has led to an exponential growth of data centers all over the world. Due to the exponential growth in size, one aspect which has contributed to a major problem is the use of energy for cooling large arrays of rack servers. Although problems with security, location, and size are a major factor, companies have tried to promote consolidating of solutions to their users, as a way to provide a green data center. The use of virtualization, co-location, and use of the natural ability of using nature as for cooling aspect of data centers. The data center of today still has the fundamental task of targeting the lowest power usage effectiveness in their business model.

A fundamental inability of the grouping of servers in a rack enclosure is the dismal approach of force fanning in order to expel heat energy from within the server rack. The approach of placing multiple servers in series in a horizontal plane culminates in adding additional fans on the server rack enclosure and cooling apparatuses providing the force cooling. This fundamental approach adds to the amount of energy require, not only because heat is dissipated in the horizontal plane, which is counterintuitive to the natural phenomena of heated air to move naturally up.

Yet another approach to removal of heat accumulated by few hundred to thousands of servers is the use of green energy. This approach takes into effect by using the natural thermal conditions of air and water in certain geographical locations. This approach takes into account the seasonal times, whereas the cold air of the winter increases the efficiency by naturally cooling a data centers and high performance computing centers. In addition, use of hydropower as a means of using the power derive as a fundamental approach of using green energy of hydropower as an acceptable approach. Although, both approaches are viable, they neglect to take into account the use of cool air during seasons only. In addition, the use of hydropower is viable as long as the power is continuous, although due to climate changes or droughts not all locations are able to use hydropower on a twenty-four hour a day, three hundred sixty five days of the year for years onward.

Recently another approach of cooling data centers and high performance computers, is dissipating the heat accumulated by hundreds to thousands of servers is the use of immersion cooling. Although, not a novel approach the immersion of electronic motherboard servers and related equipment and dipping them in a liquid solution does alleviates the heat from accumulating at the sources, it has to take into account that not all servers are made alike specifically with the materials of all electronic components. Other fundamental shortcomings of immersion cooling is the limitation to using disk drives whereby a cooling liquid solution could be catastrophic if the particular hard disk at a particular time being use is open. Another fundamental hurdle is the movement physically of servers and racks from use for maintenance or malfunction; it is not as easy as moving the servers or components in an open-air room.

In tandem growth with data centers are also high performance computing centers, also referred as supercomputers. Virtually lock-step high performance computing centers and data centers use for the most part the same hardware and software technologies. Although the objectives and missions of data centers and high performance computing centers are apparently different, in that data centers depend more on connectivity via the Internet, and the speed of supplying information. Therefore, the data centers provide information, while high performance computing are relying nowadays more and more on central processing units and graphical processing units. High performance computing centers, therefore process massive datasets by parallel processing in multiple server nodes, and therefore provide model results in shortest time possible.

In consequence, the need to process massive amounts of datasets in high performance computing centers at the shortest amount of time possible culminates in producing thus also large of amounts of heat. The advent of an objective of world governments to reach exaFLOPS performance thus create two challenges, one, the geographical consumption of electrical power which would equal large cities, and, two, the cooling of high performance computing centers.

SUMMARY OF THE INVENTION

Accordingly, besides the objects and advantages of the present invention to provide a production of energy with the heat obtain through electrical conductivity and processing by servers, is an object of the present invention to produce electricity generated by the heat accumulated by the servers and use the difference in temperature with air within the close loop system. In addition, a thermal energy accumulator receives thermal energy from various sources to provide additional thermal energy onto the thermal energy line. As the heat generated by the servers in the silos, it will be use with cold air on an opposite side of the close loop. The cold air of the close loop system is obtain by the location of a condenser in an elevated location where the temperature is much colder than at the silos. The close loop system therefore will allow the cyclical movement of the air within the close loop.

Therefore, it is an object of the present invention to provide an arrangement of one, or more than one silo, preferably underground. The silos will allow the server racks to have a set of servers align vertically without server cases. The servers will permit the flow of air upward and with use of the evaporator oval design to move the heated air to the thermal vents. Hence, an advantage of the present invention allows the free movement of heated air by the servers to move freely within the server racks towards the silo encapsulation wall without the use of force fanning present today in server farms.

Thereof, it is an object of the present invention to provide a consolidated thermal line whereby the accumulation of hot condensed compressed air can reside under pressure. Therefore, the accumulated pressurized hot condensed compressed air naturally flows upward through a main. A thermal energy conveyer is allocated between two bypassing valves. The purpose of the thermal energy conveyer is to expedite the amount of heat extracted when not using the thermal energy converter. In lieu of the servers reaching maximum performance and spiking in energy consumption, the thermal energy conveyer allows performance spikes without jeopardizing performance by force fanning. At the other side of the cycle two bypassing valves continue the flow of cold condensed compressed air without encountering resistance from the thermal energy converter wind turbine. The hot condensed compressed air under pressure is then cooled by a heat exchanger at an elevation whereby the natural ambient cools the air inside of the heat exchanger.

Hence, an advantage of the present invention allows for the hot condensed compressed air flowing naturally towards the heat exchanger to cool the hot condensed compressed air residing inside of it. The design and elevation of the heat exchanger dissipates the heat through its design and the natural flow of air passing through its condenser plates. During performance spikes, heat exchanger fans come into play by actively extracting heat vertically. The heat exchanger eliminates the need for air mass movement through force fanning as such the case in present day data centers and high performance computer centers, unless the heat exchanger fans are turn on when running at a high load.

Yet, it is an object of the present invention to provide cold condensed compressed air under pressure to move downward in elevation. The cold condensed compressed air under pressure therefore is far denser than the air moving upwards before staging in the heat exchanger. The density of the cold condensed compressed air naturally flows downward with force as it is push by the air moving towards the heat exchanger and the natural order of cold air to drop downwards. The natural phenomena of fast moving cold condensed compressed air moves down the elevation line; therefore, it is advantages of the present invention to utilize the fast movement of the cold condensed compressed air to provide kinetic energy on a turbine and generator residing inside the thermal energy converter, unless the thermal energy conveyer is being utilize during optimal peak performance.

Yet, it is an object of the present invention to provide an increase in density by a pressurize line that increases the pressure of the air in the system, therefore the cold condensed compressed air moving downward kinetic energy increases. Therefore, it is an advantage of modifying the air density in the system in order to take advantage of the increase in energy as denser air retains when heated and releases when changing to a colder temperature. In consequence, the amounts of energy in heat absorb from electrical productivity by the air in the system and the opposite amount of release in consequence of the cold temperature in an elevated region reacts as a force multiplier.

Thereof, it is an object of the present invention to use the pressure line to change the composition of the air, therefore to change the chemistry, in order to decrease or increase the humidity of the gaseous compound. In consequence, the object is also change the chemistry in order to increase or decrease energy transfer of the gaseous compound. In addition, it is the object of the pressure line to change the chemistry of the gaseous compound in order to change the speed of extraction of energy from the servers. In a compounded manner, it is an advantage of the present invention to change the rate of energy production from the system through the variations in chemistry of the gaseous compound in the system.

In addition, it is an advantage of the thermal energy conveyer to work at over one hundred percent efficiency due to taking advantage of the thermal imbalance between the silo temperatures and heat exchanger condenser elevation temperatures. The natural occurrence of very low temperatures at high elevation, while the accumulation of pressurize heated air in the consolidated thermal line permits the thermal energy conveyer to expedite the workload many times over, therefore force multiplying work due to the natural phenomena of the heated gaseous element to rise from above the conveyer turbine to in turn cold condensed compressed air to subside at the opposing side of the conveyer cycle.

Furthermore, it is an object of the present invention to produce its own energy from the differential in temperature from the silos to the heat exchanger, when bypassing the thermal energy conveyer. As the amount of energy from the silos that accumulates moves through the system is accelerated due to the natural phenomena of hot condensed compressed air to rise, and the natural effect of the heat exchanger to discharge the heat energy, force multiply the acceleration of pressurize cold condensed compressed air to move downward to the thermal energy converter, it is therefore an advantage of the present invention to create electrical energy from its own source unlike prior art. It is in effect that the present invention can generate electrical power for use internally back to the servers and related electrical components, or use the electricity generated to a foreign local. The advantage of generating its own power further reduces the power usage effectiveness of the data center or the optimal performance of the high performance computer. Under ideal circumstances whereas the amount of heat energy provided by the servers and outside environment, is far in amount in energy content to the opposing air at higher elevations and in particular the heat exchanger that the amount of energy use in the high performance computing center is exceeded by the amount of energy in electrical power produce therefore attributing to a negative power usage effectiveness.

In so far, it is an object of the present invention to recycle the downward cold condensed compressed air and move it back to the silos. Therefore the design allows small pituitary lines to force air onto the evaporators align with the server racks, with some going to the thermal energy accumulator, while the rest of the cold condensed compressed air moves from below the silos. Therefore it is an advantage of the present invention to recycle the air in the system by natural means as oppose to prior art whereas recycle air is by means of force, unless during peak performance. The natural phenomena of hot condensed compressed air to rise promotes a suction force thereby creating a natural force which recycles the energy in the air mass as it completes a full circle inside the semi-hermetic air line.

In addition, it is an object of the present invention to provide a thermal energy accumulator that provides additional thermal energy from various sources in combination or independent of each other. The thermal energy accumulator complements additional thermal energy into the cyclical system by receiving already compress condense cold air from the cold air main, of which is then distributed by the cold air main valve vent of which in turn distributes by the distribution valve to the various sources. The various sources in turn are provided a source of thermal relieve from their work. The various sources then convert the cold condensed compressed air to hot condensed compressed air by heat exchangers, therefore send the hot condensed compressed air by their heat exchangers to the outlet convergence valve onto through the convergence valve then sends the hot condensed compressed air to the thermal line.

Therefore, it is an object of the present invention to provide additional thermal energy sources outside the cooling of the servers on racks, by providing additional sources of thermal energy from outside the cyclical cycle which provides thermal energy from within the system as well as the outside environment. Whereas, it is an object of the present invention to provide heat energy generated by transformers, an outside parking lot, and a roof top structure of the high performance computing building. Whereas yet, it is an object of the present invention to provide heat energy generated by an air conditioning system, from generators, and uninterruptable power supply. In addition, it is an object, of the present invention to provide heat energy generated by the thermal energy conveyer motor, the thermal energy converter generator, as well as the thermoelectric generator. Whereas yet, it is an object of the present invention to provide heat energy from the thermoelectric gradient inducer.

Therefore it is an advantage of the present invention to provide thermal energy from the transformers which in kind require cooling and therefore provide an additional thermal source. In lieu of work, resistive heating is experience with any load to a transformer. Even when working within their temperature grades, the transformers will incur losses in performance efficiency. Therefore, by providing cooling from the cold condensed compressed air, the transformers in kind will convert the cold condensed compressed air with aid from heat exchangers to condensed compress hot air. Heat exchangers, therefore send the hot condensed compressed air to the outlet convergence valve onto through the convergence valve then sends the hot condensed compressed air to the thermal line.

Another advantage of the present invention is to provide thermal energy from an outside parking lot which in kind can provide thermal energy, therefore aggregating an additional source of thermal energy. As with any parking lot in an outside environment solar energy wavelengths reaching the surface in ultraviolet, visible, and infrared, will convert the parking lot of the high performance computing center to a heat island. In lieu of constant bombardment of solar radiation, sets of pipes acting as heat exchangers under the parking lot provide heat energy. Heat exchangers, therefore send the hot condensed compressed air to the outlet convergence valve onto through the convergence valve then sends the hot condensed compressed air to the thermal line.

In addition, another advantage of the present invention is providing thermal energy from the roof top of the building. Even with limited surface area roof top, will receive solar energy wavelengths reaching the roof top in the ultraviolet, visible, and infrared. In lieu of constant bombardment of solar radiation, sets of heat exchange modules harness the solar radiation. The heat exchangers, therefore send the hot condensed compressed air to the outlet convergence valve onto through the convergence valve then sends the hot condensed compressed air to the thermal line.

Yet another advantage of the present invention is to provide thermal energy from the air conditioning system. Sets of radiators acting as heat exchangers would receive from the condensers heat energy and in turn the heat exchangers connected via the distribution valve receive condensed compress cold air, and in turn convert it to hot condensed compressed air, therefore rather than the heat extrapolated to the outside environment would rather be reintroduce into the cyclical cycle from the heat exchangers to the outlet convergence valve onto the convergence valve and into the thermal line.

Yet another advantage of the present invention is to provide thermal energy from the generators, also known as gensets provide standby or additional electrical power. As with gensets in high performance computing centers, when put to work, the gensets provide power via electrical generator attach to an engine. When the engines begin to work, the gensets produce heat energy from the engine itself and the electrical generators. Therefore, radiators attach to the engines and generators, acting as heat exchangers will receive heat energy. Cold condensed compressed air receive from the heat exchangers from the distribution valve coming cold air main valve vent. Heat energy receive from the heat exchangers in turn send condensed compress hot air to the outlet convergence valve onto the convergence valve and into the thermal line.

Still another advantage of the present invention is to provide thermal energy from the uninterruptible power supply. Uninterruptible power supply when connected to the load will experience heat dissipation. Requiring adequate ventilation from work heat exchangers connected to the uninterruptible power supply connected to the distribution valve coming from the cold air valve vent are provided thermal relief with cold condensed compressed air. In addition to uninterruptible power supply when connected to the load will produce harmonics or unwanted currents that increase heat losses in upstream wiring and transformers thereby decreasing efficiency. Thereby, heat exchangers will relieve the uninterruptible power supply from proportional losses and in turn provide heat energy which when transfer to the heat exchangers will supply the thermal energy to the outlet convergence valve onto the convergence valve and into the thermal line.

Whereas yet, an additional advantage of the invention is that thermal energy conveyer motor provides an additional heat energy source. In lieu of electrical motors, the thermal energy conveyer motor provides a high rate of efficiency therefore complementing heat accumulated return into the system. Working within operating temperature, the thermal energy conveyer motor experiences variations in load which provide resistance to load and thereby decrease in efficiency with time. As with the increments in inefficiency experience with time, the thermal energy conveyer motor will experience increase heat radiated. Thereby, heat exchangers will relieve the thermal energy conveyer motor from heat losses and in turn provide heat energy which in turn transfer to the heat exchangers which will supply the thermal energy to the outlet convergence valve onto the convergence valve and into the thermal line.

Besides, the thermal energy conveyer motor providing thermal energy, another advantage yet, is the thermal energy converter generator provides an additional source of heat energy. In lieu of electrical motors, the thermal energy converter generator provides a high rate of efficiency therefore complementing heat accumulated return into the system. Working within operating temperature, the thermal energy converter generator experiences variations in load which provide resistance to load and thereby decrease in efficiency with time. As with the increments in inefficiency experience with time, the thermal energy converter generator will experience increase heat radiated. Thereby, heat exchangers will relieve the thermal energy converter generator from heat losses and in turn provide heat energy which in turn transfer to the heat exchangers which will supply the thermal energy to the outlet convergence valve onto the convergence valve and into the thermal line.

In so far, it is an advantage of the present invention to make use of a thermoelectric generator. The combination of having proximity between waste heat and cold condensed compressed air allows for the utilization of thermoelectricity. An advantage of having a continuous flow of cold condensed compressed air flowing in one direction and having an opposing flow of heated compress air moving to the other direction allows for a thermoelectric generator to produce power. Therefore, cold condensed compressed air coming from the cold air main valve vent passing through the distribution valve will flow through the thermoelectric generator cold inlet. Inside the thermoelectric generator various chambers have insulated walls where the cold condensed compressed air will flow unimpeded an onto the thermoelectric generator cold outlet. On the other sides of these chamber walls compress condense hot air coming from the thermoelectric generator main through the thermoelectric generator thermal energy inlet will pass through and will flow through the thermoelectric generator thermal energy outlet through the excess waste heat main back onto the thermal line.

Whereas yet, another advantage of the present invention is to use waste heat foreign sources as well as within the system in order to aggregate additional recombinant heat energy by using a thermoelectric gradient inducer. The thermal gradient inducer recycles waste heat onto the thermal line, therefore inducing a continuous cyclical cycle when insufficient thermal energy is coming from the silos. In addition, the thermoelectric gradient inducer provides into itself waste heat from outside sources in addition allowing condensed compress cold air to flow opposing sides within inside chamber walls, therefore it is an advantage of the present invention to provide the thermoelectric gradient inducer which also produce power as well as provide thermal energy onto the thermal line, itself, as well as the thermoelectric generator. Furthermore, the additional sources of heat energy increase the efficiency of energy introduce into the cyclical cycle by using the energy input plus energy from the outside environment. Therefore, cold condensed compressed air coming from the cold air main valve vent passing through the distribution valve will flow through the thermoelectric gradient inducer cold inlet pass the inner chamber walls of the thermoelectric gradient inducer walls an onto the thermoelectric gradient inducer cold outlet onto the convergence valve and into the thermal line via the convergence valve. In so far, the thermoelectric gradient inducer will receive waste heat from outside the system, as well as within the system by way of the thermoelectric generator main, and the waste heat line. The thermoelectric generator main receives thermal energy from the thermal line, and the waste heat line through the waste heat valve and the waste heat to thermoelectric generator main valve. Therefore, it is an advantage of the thermoelectric generator to use regeneration heat energy, as well as waste heat from outside the system, for an additional source of power.

In so far, an object of the present invention is to reduce greenhouse gases by using heat energy byproduct to produce its own energy for the high performance computing center internal use and to export an excess amount to other places. Therefore, an advantage of the present invention is to take advantage of its own energy production from the heat energy produce and reduce the total amount of electrical energy use by the high performance computing centers in order to reduce anthropogenic human influence on the environment.

BRIEF DESCRIPTION OF THE DRAWINGS

FIG. 15g is a schematic diagram of a thermal energy conveyer.

FIG. 15h is a schematic diagram of a thermal energy converter.

DETAILED DESCRIPTION OF THE PREFERRED EMBODIMENTS

Various aspects in detail of the present invention are shown in the following description in accordance with the present invention. In accordance with the design of high performance computers one of the biggest obstacles is to remove heat energy that accumulates with time. The present invention will show not only how to remove heat energy from a building but also to use the heat with various proven anomalies use in advantage towards producing power from the heat and natural occurrence of the absence of heat present in high terrestrial elevations.

Figure 1:
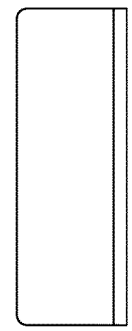
FIG. 1 is a side view of servers without a case; aligned parallel to each other sideways on two rail rods.

FIG. 1 is a close-up end view of a plurality of servers 100 aligned at ninety-degree angles in order to let the natural occurrence of heat to release upward. Natural flow of heat emanating from the plurality of servers 100 will create server thermals 102 to move upward. The motherboard 101 having all electronic subcomponents will conduct heat from electrical activity. Having a plurality of servers 100 in the previously mentioned configuration allows heat to move upward along the plurality of servers 100, which are retained between a pair of server rails 103.

Figure 2:
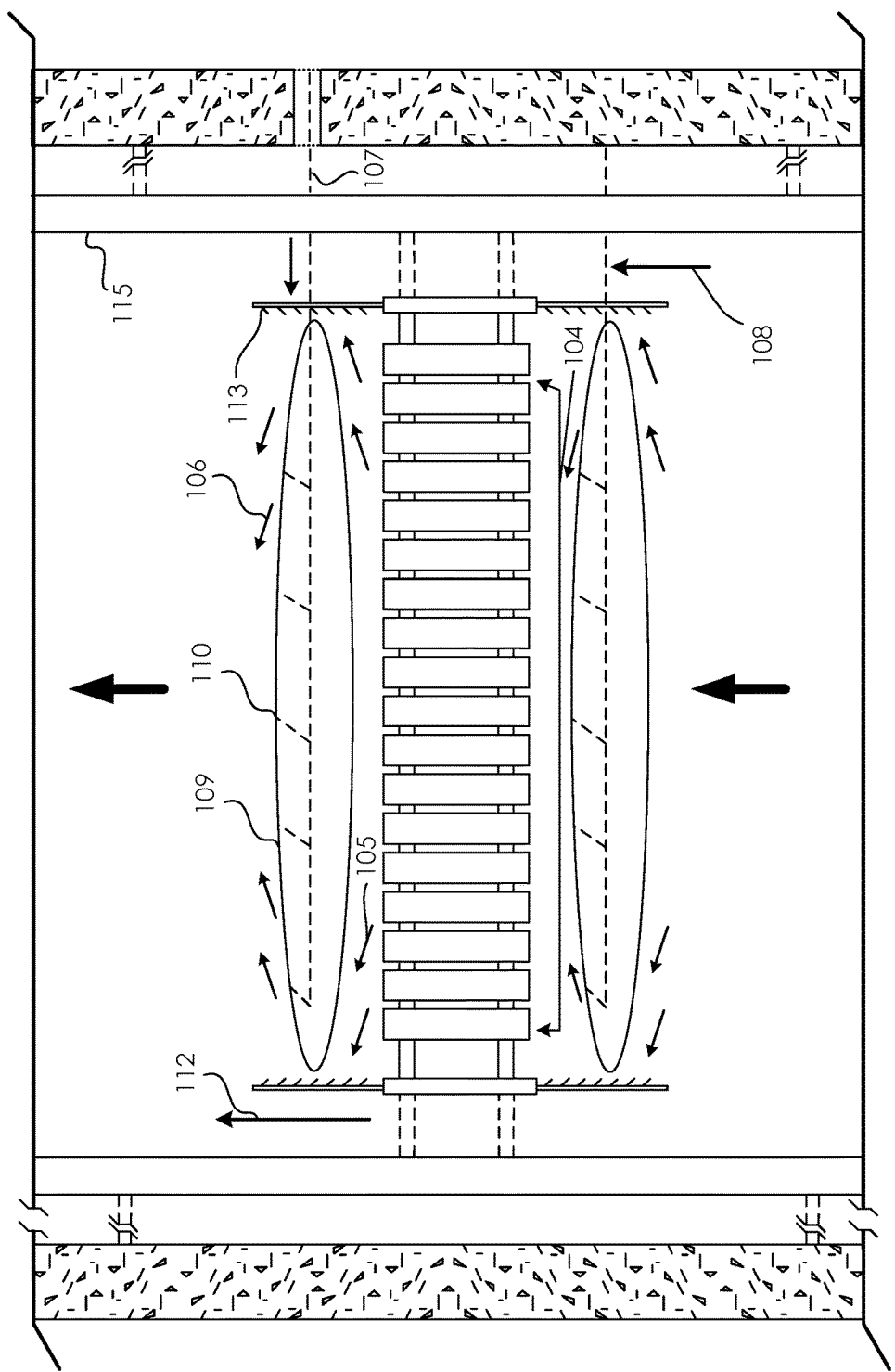
FIG. 2 is a set of servers aligned parallel to each other sideways on rail rods with evaporator coolers located above and below the set of servers.

FIG. 2 is a side view of a server rack 104 with a plurality of servers 100, which together create a pocket of heat of which with natural occurrence allows for an accumulation of server rack thermal 105 to naturally dissipate upward. A special design evaporator 109 with an oval bottom pushes the server rack thermal 105 to the sides onto thermal vents 113 which in turn pushes the heat outward from the server rack 104. The evaporator 109 top is equally oval as the bottom half, which in turn has several capillary openings 110 that allow cool air 106 to slip out coming from the cool air line 107. In order to prevent the natural occurrence of heat from accumulating, the evaporator 109 resides on top of the server rack 104 and another will reside below the server rack 104 in order to introduce the cool air 106 to substitute the departing server rack thermal 105 air.

The server rack thermal 105 air that departs outward through the thermal vents 113 gradually accumulates on the sides that together with more air that is heated coming from other thermal vents 113 accumulates on the sides. The left side thermal 112 and the right side thermal 108 gradually accelerate in speed upward within the silo encapsulation wall 115. This process perpetuates the movement of heated air by creating a coriolis effect within the silo encapsulation wall 115.

Figure 3:
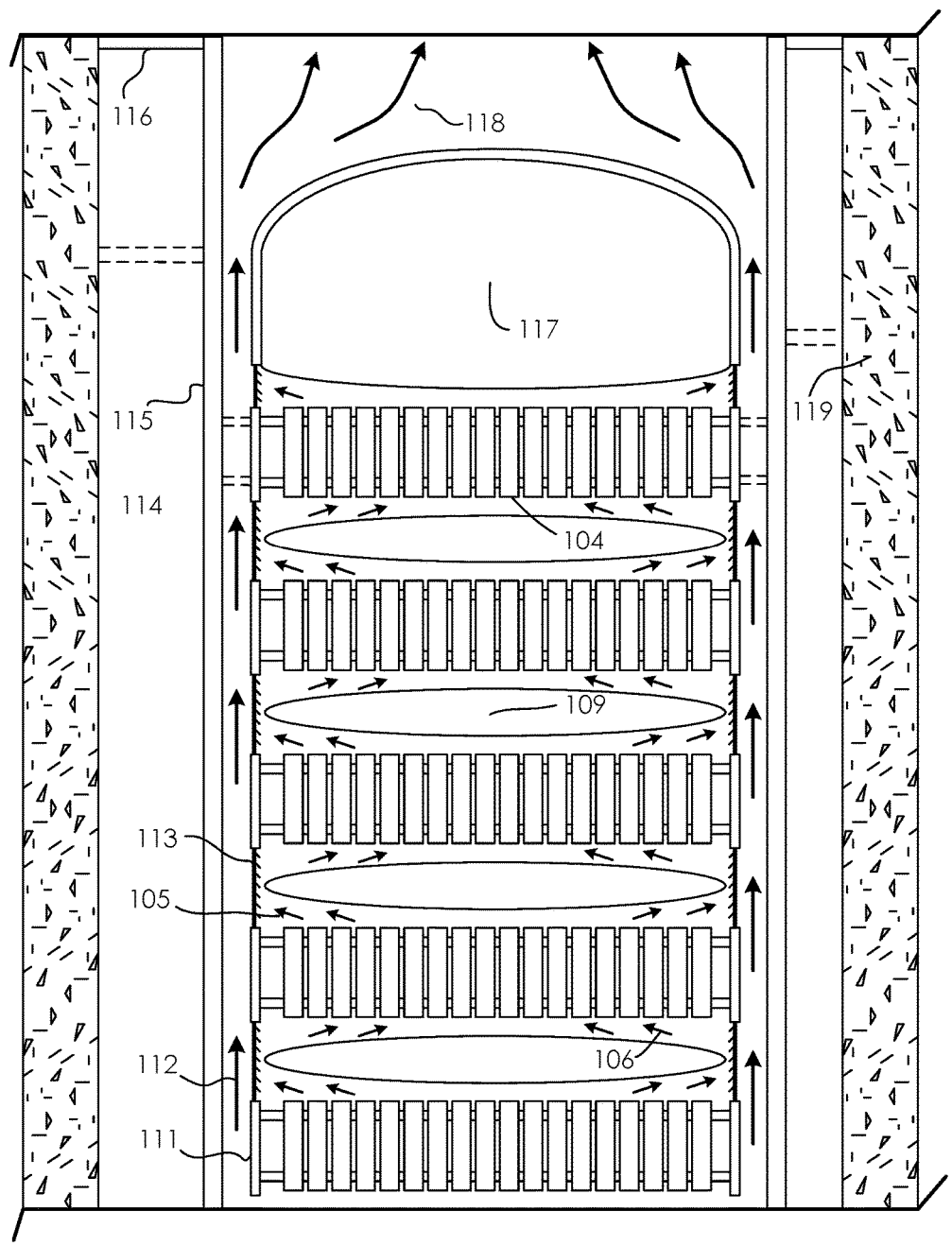
FIG. 3 is a side view section of a silo exemplifying how the server rod-configure racks are align.

FIG. 3 is a side view of multiple server racks 104 and evaporators 109. Together align in that sequence in accordance to FIG. 3, which permits a strong rapid movement of venting air. In FIG. 3 coming from the bottom side, a strong wind pattern perpetually moves heated air upward. At the bottom of FIG. 3 a server rack bracket 111 sustains the server rack 104 and the thermal vents 113 of which in turn the server rack brackets 111 also serve as a deterrence from letting the server rack thermal 105 and the cool air 106 from moving sporadically. Therefore, the server rack brackets 111 keep the movement of air uniformly moving through the thermal vents 113. Having multiple server racks 104 and evaporators 109 in accordance with FIG. 3, the left side thermal 112 and the right side thermal 108 will move rapidly towards the top whereby an air spoiler 117 resides. The silo encapsulation walls 115 will prohibit the fast moving heated air from venting other than upward. On top of the air spoiler 117, hot condensed compressed air 118 will accumulate of which then will leave onto another step in the process. The air spoiler includes a top with a convex or outwardly curving outer surface. Surrounding the silo encapsulation walls 115 is on a side is the access space 114, which is used for letting personnel to work on the servers and pertinent mechanics. The access space roof 116 is the limit between the silo encapsulation walls 115 and the silo wall 119. Keeping the whole structure within the silo encapsulation walls 115 from collapsing with its own weight are metal beams holding them in place.

Figure 4:
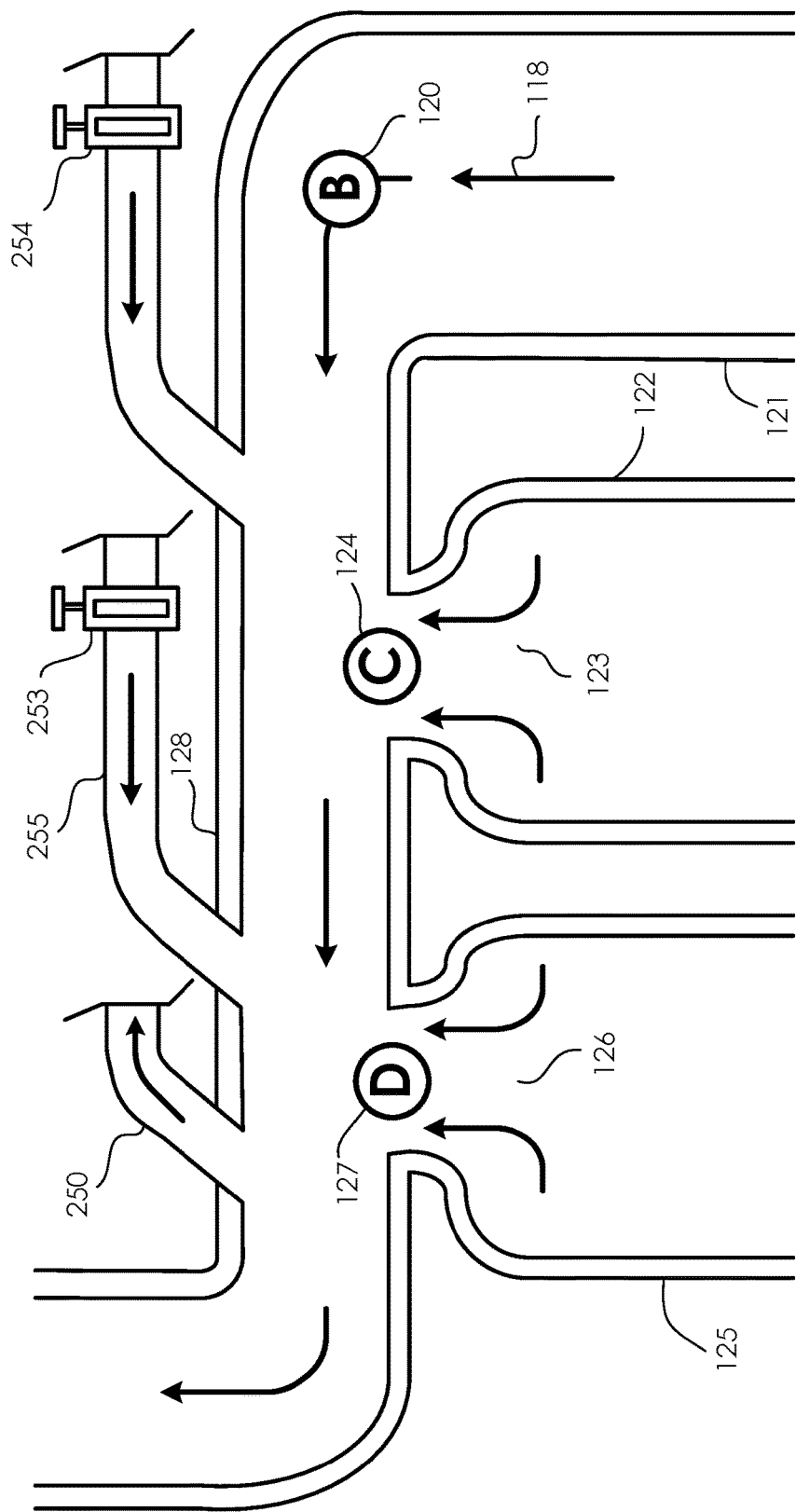
FIG. 4 shows the main line where each silo connects and sends the cumulative heated air mass towards the next stage towards the thermal line.

FIG. 4 shows another step in the process whereby the hot condensed compressed air 118 accelerates to the top of a primary silo 121, in a multi-silo design. At the top of the primary silo 121 is the primary heat accumulator 120, which is the location onto where the hot condensed compressed air 118 accumulates. A secondary silo 122 with secondary silo hot condensed compressed air 123 will also have a secondary heat accumulator 124. At the left of FIG. 4 is a tertiary silo 125 also with tertiary silo hot condensed compressed air 126. Together the primary accumulator 120 with the secondary heat accumulator 124 in conjunction with a tertiary heat accumulator 127 will create even greater compress hot air pressure in the thermal line 128. A top of the thermal line 128 additional hot condensed compressed air 118 is introduced by the convergence valve 254. In addition, the excess waste heat main 255 and waste heat exit valve 253 is shown. The thermal line main 250 is shown with hot condensed compressed air 118 moving towards the waste heat to thermoelectric generator main valve 256.

Figure 5:
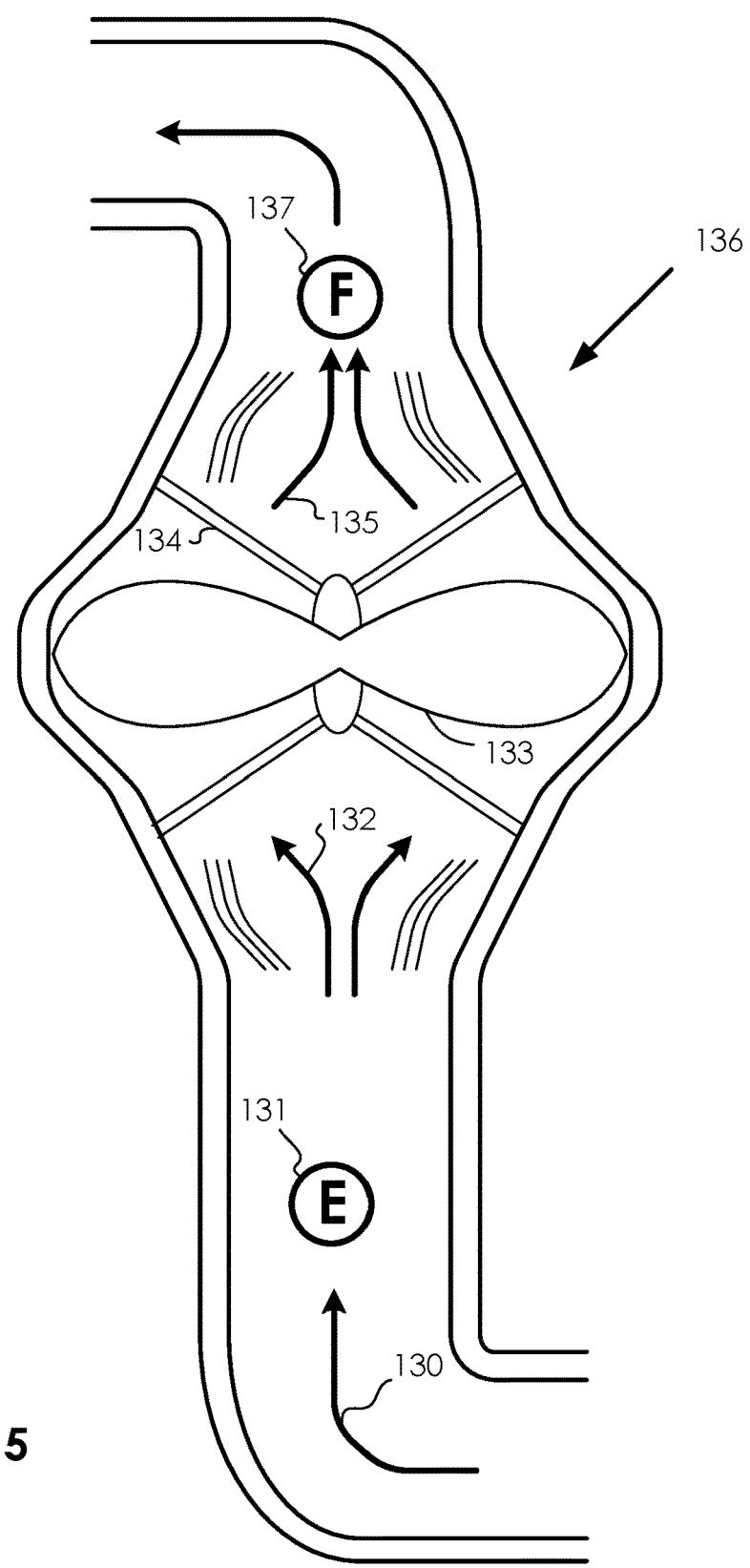
FIG. 5 is the thermal energy conveyer receiving hot condensed compressed air mass coming from the thermal line.

FIG. 5 illustrates from bottom to top on how the incoming hot condensed compressed air 118 reaches the compress hot air vent 130 of which sends the compress hot air accumulator 131 to the decompress hot air coriolis point 132. The decompress hot air coriolis point 132 creates a vortex like swirl due to the internal design. The pressurize hot condensed compressed air 118 that passes through the decompress hot air coriolis point 132 in turn helps accelerate the movement of a turbine fan 133 residing inside the thermal energy conveyer 136. Turbine brackets 134 reside inside the thermal energy conveyer 136 of which has in addition a compress hot air coriolis point 135 that is a step whereby the hot condensed compressed air 118 that passes accelerates the vortex like swirl through the coriolis swirling point 137. Two valve vents are aligned with hot condensed compressed air main 139, the first valve vent 129 and second valve vent 138, which depends, when open or close allows the flow of hot condensed compressed air 118 to bypass or channel through the thermal energy conveyer 136.

Figure 6:
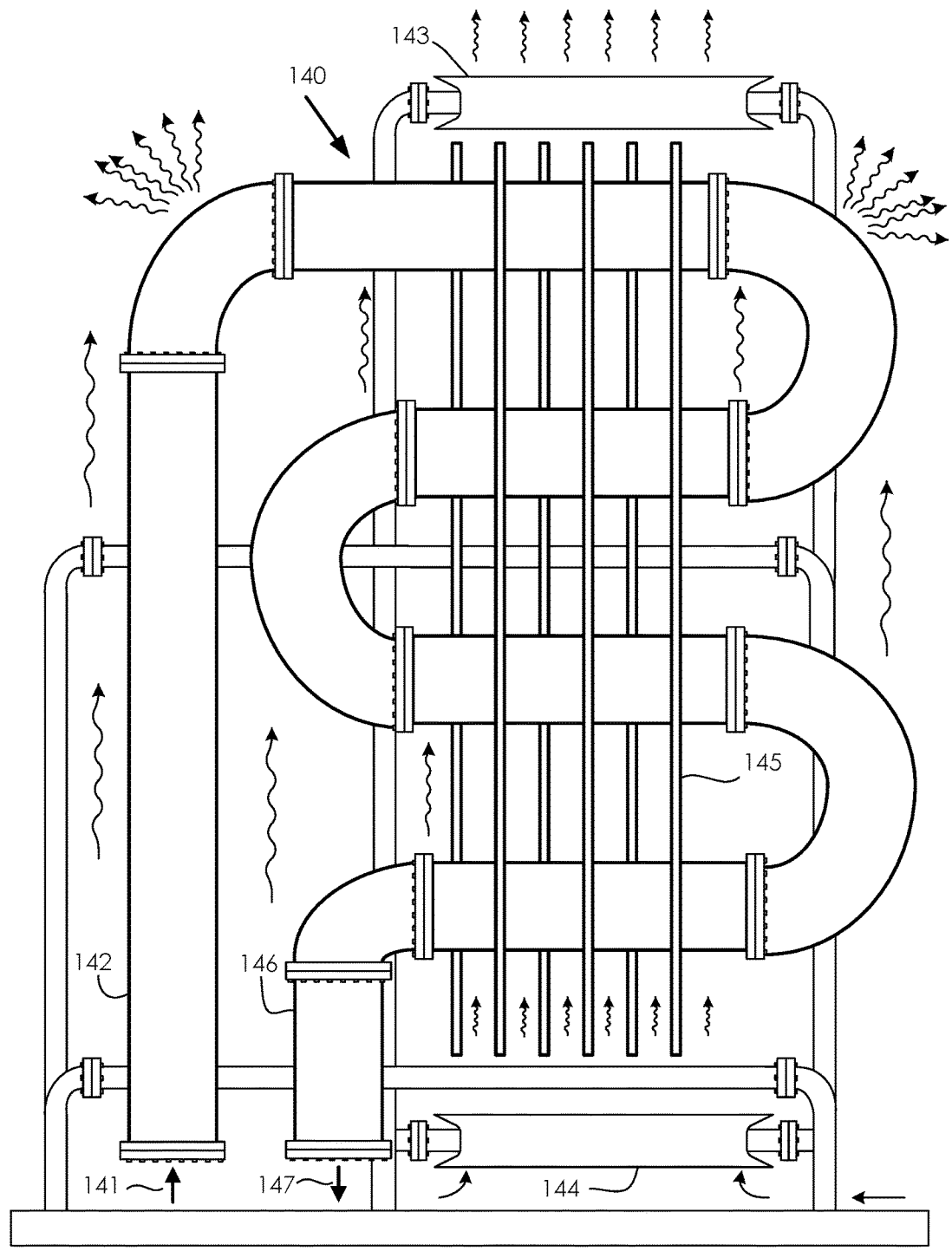
FIG. 6 is a view of the outdoor condenser with the upper heat exchanger fan and the lower heat exchanger fan.

FIG. 6 is a heat exchanger 140 residing primarily at a top of a mountain whereby cold air resides. With reference to FIG. 5, the hot condensed compressed air main 139 sends hot condensed compressed air 118 up to the heat exchanger 140. The natural behavior of hot condensed compressed air 118 to move up accelerates through the hot condensed compressed air main 139 to the heat exchanger 140. The hot condensed compressed air condenser entry 141 receives the hot condensed compressed air 118 of which then passes through the condenser air entry 142. As the hot condensed compressed air 118 passes through the heat exchanger 140, the hot condensed compressed air 118 will cool and condense, as the temperature of the hot condensed compressed air 118 will cool. As the ambient air with the natural occurrence of wind on top of a high elevation point the heat exchanger 140 is further cooled by condenser plates 145. In addition, an upper heat exchanger fan 143 and another lower heat exchanger fan 144 expedites the rates of heat loss on the heat exchanger 140. Once the hot condensed compressed air 118 passes through the heat exchanger 140 it will turn to cold condensed compressed air 149. The cold condensed compressed air 149 will pass through the condenser air main exit 146 and out through the cold air condenser exit 147.

Figure 7:
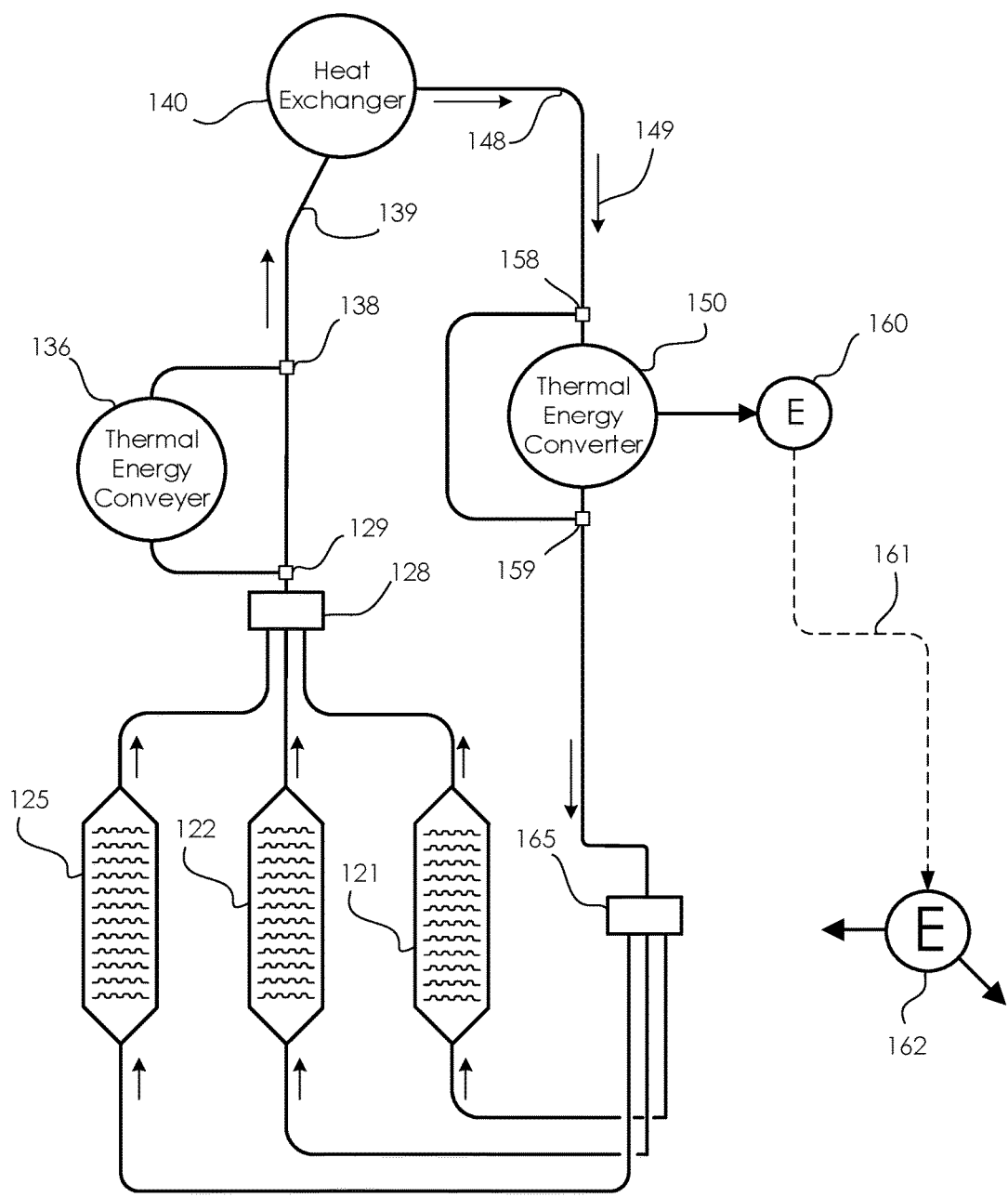
FIG. 7 is a diagram of the present invention process.

FIG. 7 is a schematic diagram of the invention and process. As the cold condensed compressed air 149 leaves the heat exchanger 140, the cold condensed compressed air 149 moves downward through a cold air main 148 downward to an air basement 165. Before reaching the air basement 165, the cold condensed compressed air 149 goes through the thermal energy converter 150. A third valve vent 158 together with a fourth valve vent 159 allows the movement of cold condensed compressed air 149 to bypass or channel through the thermal energy converter 150. In lieu of the cold condensed compressed air 149 passing inside the thermal energy converter 150, a wind turbine 154 will create electric power 160. The electric power 160 created will then pass through transmission lines 161 then to the distribution lines 162. The distribution lines 162 allow for recycling of the electric power 160 back to the data center or high performance computing center or to the local grid.

The natural movement of cold condensed compressed air 149 moves downward perpetuated by the circulatory motion of the hot condensed compressed air 118 to rise and the cold condensed compressed air 149 to drop downward. From the air basement 165 the cold condensed compressed air 149 moves back to the primary silo 121, the secondary silo 122, and the tertiary silo 125. At the middle of the diagram, the next step is the movement of the hot condensed compressed air 118 as the cold condensed compressed air 149 has already heated by passing through the silos. The hot condensed compressed air 118 passes through a thermal line 128 and onto the hot condensed compressed air main 139 when bypassing or channeling through the thermal energy conveyer 136, through first valve vent 129 and second valve vent 138 an onto the heat exchanger 140. A thermal energy accumulator 211, which connects to several systems and components add further heat energy from within the cyclical system and from the outside environment. The thermal energy accumulator 211 is connected through heat exchangers between the cold air main 148 and the thermal line 128, by way of the outlet convergence reverse manifold 248 and the convergence valve 254. On the side of the cold air main 148 the cold air main valve vent 212 connects to the distribution manifold 213.

Figure 8:
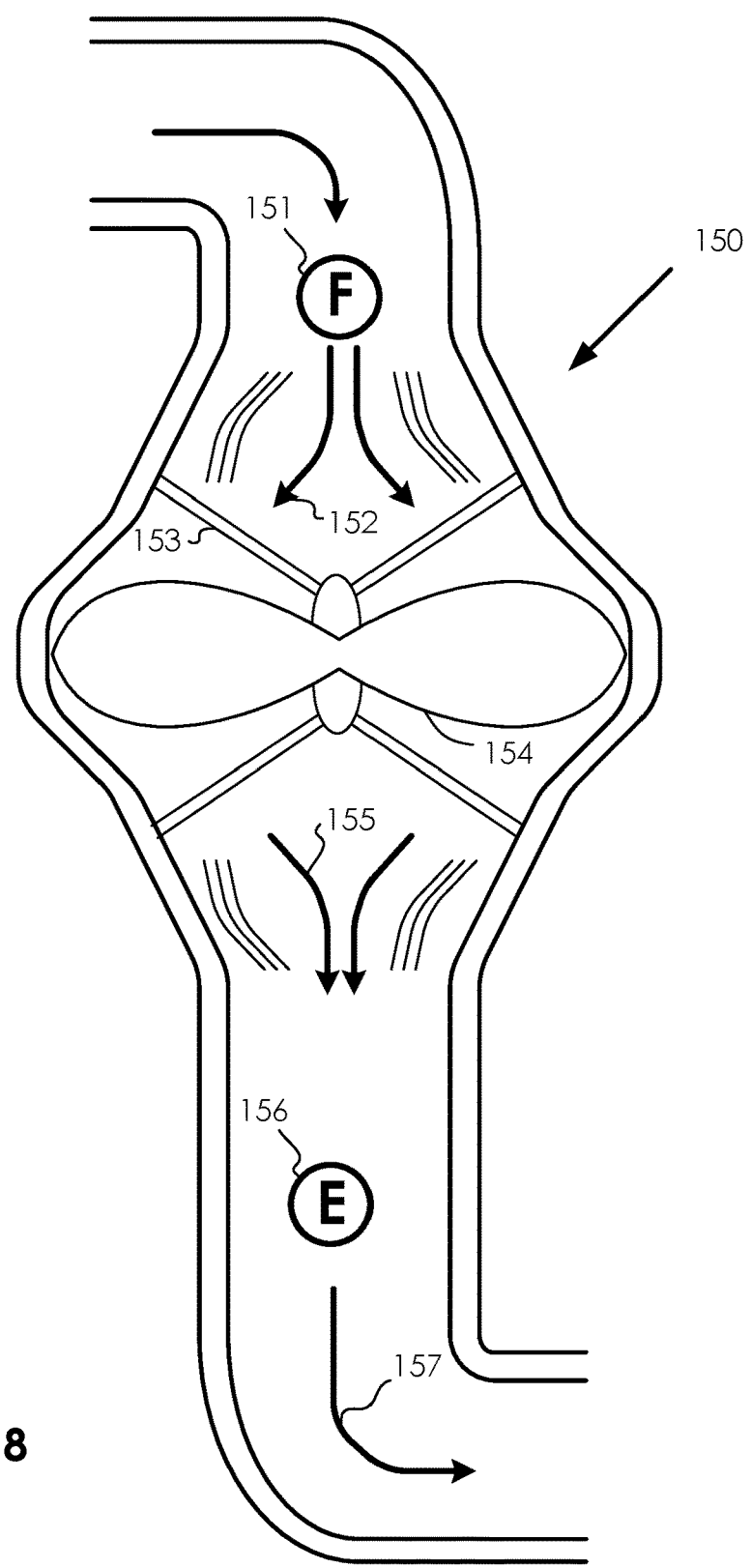
FIG. 8 is the thermal energy converter receiving cold condensed compressed air mass coming from the outdoor condenser.

FIG. 8 illustrates from top to bottom on how the incoming cold condensed compressed air 149 reaches the cold air compression spoiler 151 of which sends the cold condensed compressed air 149 to the cold air coriolis decompression point 152. The cold air coriolis decompression point 152 creates a vortex like swirl due to the internal design. The pressurize cold condensed compressed air 149 that passes through the cold air coriolis decompression point 152 in turn helps accelerate the movement of a wind turbine 154 residing inside the thermal energy converter 150. Turbine brackets 153 reside inside the thermal energy converter 150 of which has in addition a cold air coriolis compression point 155 that is a step in itself whereby the cold condensed compressed air 149 that passes accelerates the vortex like swirl through the cold air accumulation point 156 is compress again before entering the cold air compression spoiler 157. The third valve vent 158 and the fourth valve vent 159 allow the cold condensed compressed air 149 to bypass the thermal energy converter 150 when selecting to accelerate air movement.

Figure 9:
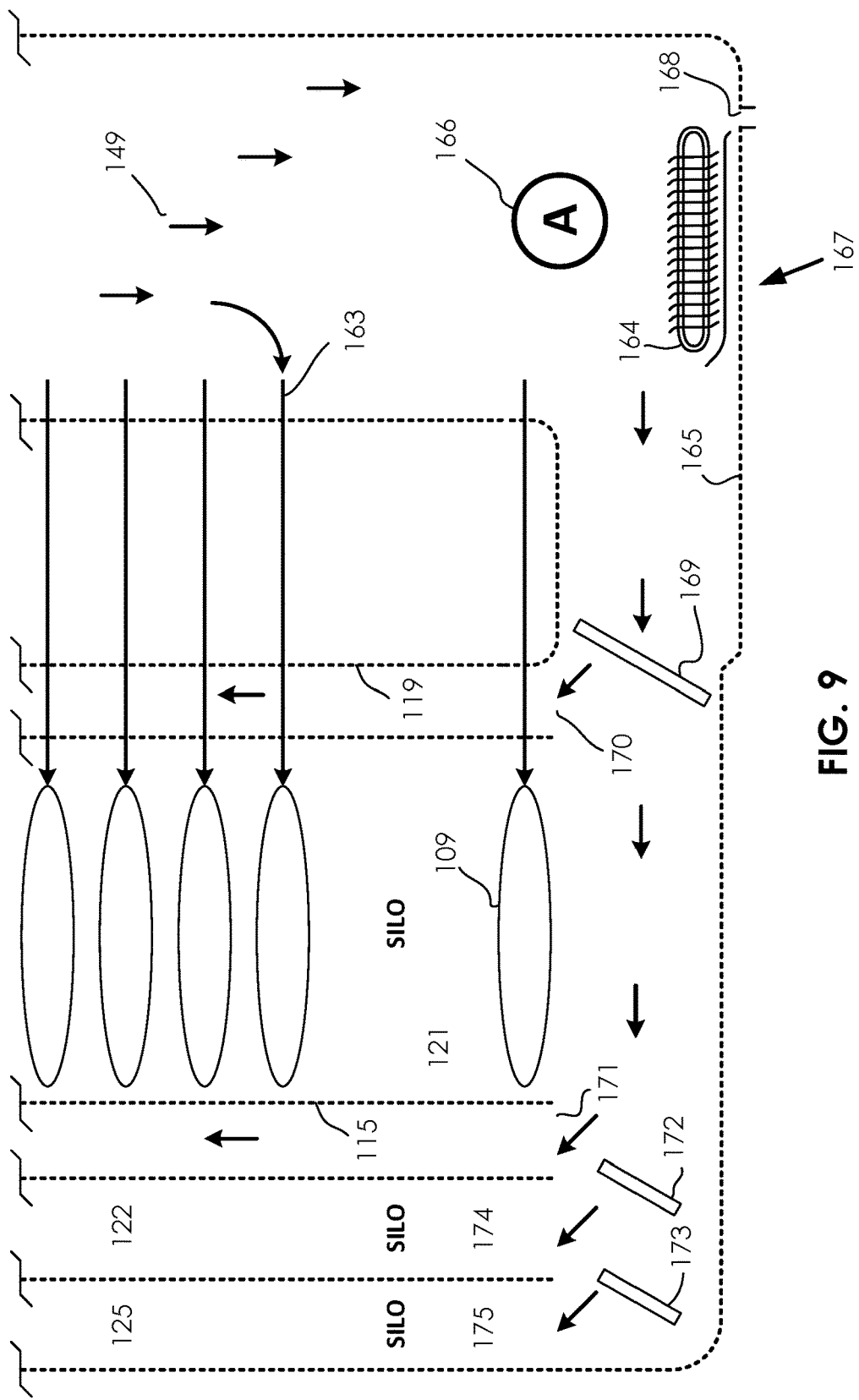
FIG. 9 is a bottom part of the present invention where the cool condense air sinks before moving towards the server silos.

FIG. 9 illustrates how part of the invention process works. As the condensed compress cold air 149 moves towards the air basement 165, some of the condensed compress cold air 149 moves through evaporator capillary tube lines 163, which in turn are pushed by the condensed compress cold air 149 behind coming through the cold air main 148. The same cold condensed compressed air 149 passing through the evaporator capillary tube lines 163 are pulled in by convective forces of which is further perpetuated by the left side thermal 112 and the right side thermal 108 winds. The cold air main 148 reaches the air basement 165 at the bottom end. At the air basement 165 that is the lowest depth of the cycle a cold air condensate pool 166 of cold condensed compressed air 149 resides. A humidity control device 164 resides in the basement. The purpose of the humidity control device 164 is for controlling the amount of humidity in the cold condense compress air 149. The air basement 165 being the deepest part of the process has a drain 168 for water condensation. The subterranean earth 167 is where the air basement 165 resides. Most of the cold condensed compressed air 149 which is not send through the evaporator capillary tube lines 163 passes onwards to the main valve 169. Passing the main valve 169 is the primary silo right entry 170 and the primary silo left entry 171 which together are at the base of the primary silo 121. The purpose of the primary silo right entry 170 and the primary silo left entry 171 is to receive the cold condensed compressed air 149. Walls that make the primary silo 121 are the silo encapsulation wall 115 which is used to sustain in part the evaporators 109 in place in addition to receive the cold condensed compressed air 149 from the evaporator capillary tube lines 163. An additional purpose of the silos encapsulation wall 115 in conjunction with the silo wall 119 is to sustain rapid cold condensed compressed air 149 at the lower level of the primary silo 121 and at the top most level of the silo hot condensed compressed air 118 in moving expeditiously and effortlessly. At left of FIG. 9 is the secondary silo air valve 172 which is the valve for allowing cold condensed compressed air 149 to flow inward through the secondary silo air entry 174 an onto the secondary silo 122. A tertiary silo air valve 173 allows the flow of cold condensed compressed air 149 into the tertiary silo 125 through the tertiary silo air entry 175.

Figure 10:
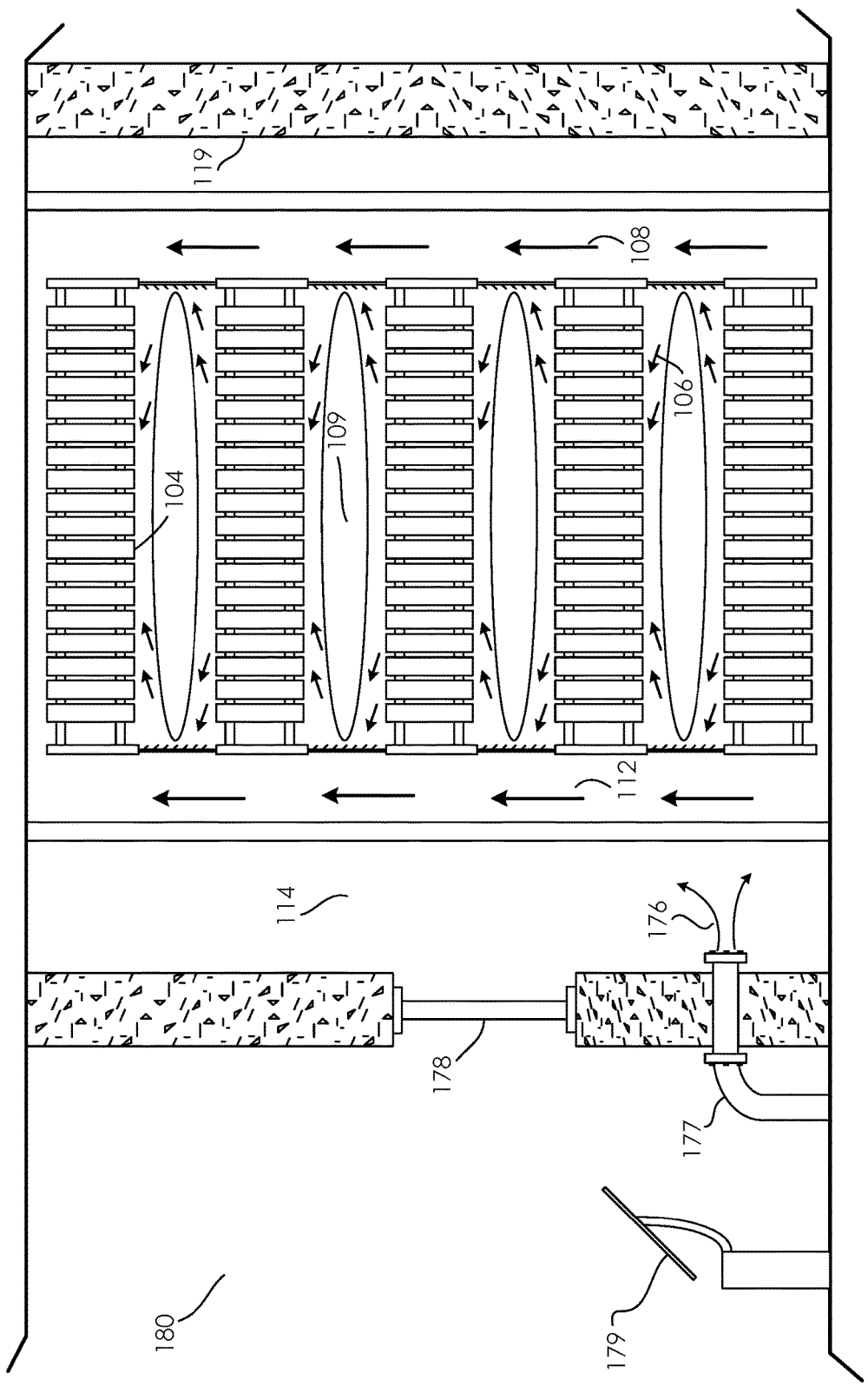
FIG. 10 is a cut view of the command & control room and high performance computing center silo.

FIG. 10 is the primary silo 121 back again complementing almost a complete cycle coming from FIG. 7. In FIG. 10 the cold condensed compressed air 149 coming from the air basement 165 is received as it passes through the server racks 104 and the air that did not came directly from the air basement 165 is receive through the evaporator 109 coming through the silo wall 119. The hot condensed compressed air 118 coming from the server racks 104 is then forwarded upward through the thermal vents 113 as the hot condensed compressed air 118 is accelerated upward by its temperature and the left side thermal 112 and the right side thermal 108. On a left side of FIG. 10 is the access space 114 which is kept pressurized together with hot condensed compressed air 118 and the cold condensed compressed air 149 that circulates. Air 176 is introduced by a compress air line 177 for the purpose of increasing the amount of air inside the circulatory system. As the air 176 is compress, the air 176 increases in energy capacity as the energy in the air 176 is able to increase in force inside the thermal line 128 as the hot condensed compressed air 118 density is able to more forcefully through the hot condensed compressed air main 139. An observation window 178 lets personnel in the command & control room 180 observe the primary silo 121. A command & control station 179 lets users oversee operations.

Figure 11:
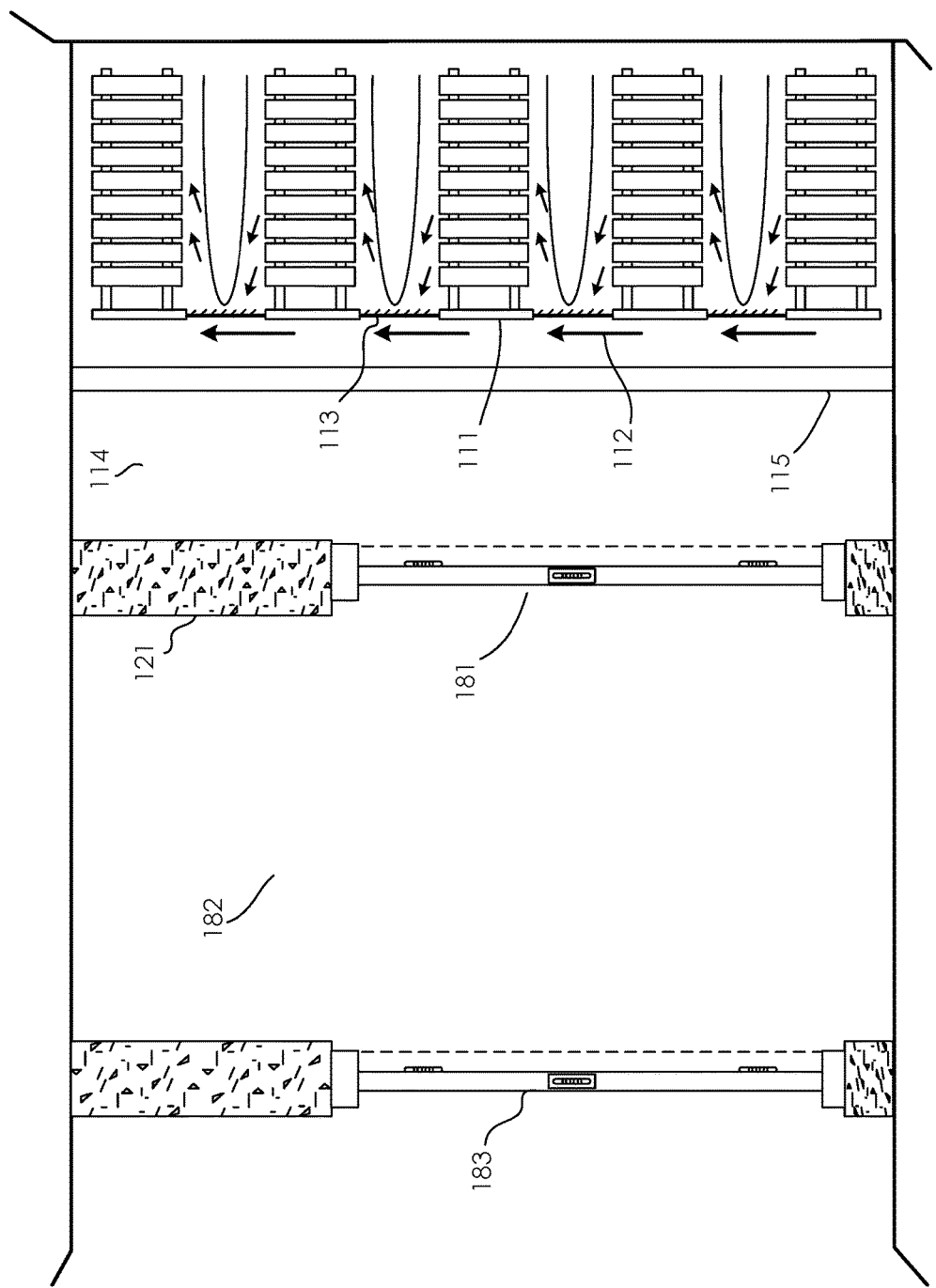
FIG. 11 is a cut side view of the pressure chamber and a silo.

FIG. 11 shows an open view of the primary silo 121 with silo encapsulation wall 115 that controls in part, the movement of the left side thermal 112. The server rack bracket 111 together with the silo encapsulation wall 115 and the thermal vents 113 allow for rapid movement of the hot condensed compressed air 118. Left of the access space 114 is a compression room 182 with a primary silo door 181 that allows access to the access space 114. The compression room 182 also has a compression room entry 183 for entry to the compression room 182. The purpose of the compression room 182 is to equalize the air 176 in order to allow personnel to enter the primary silo 121.

Figure 12:
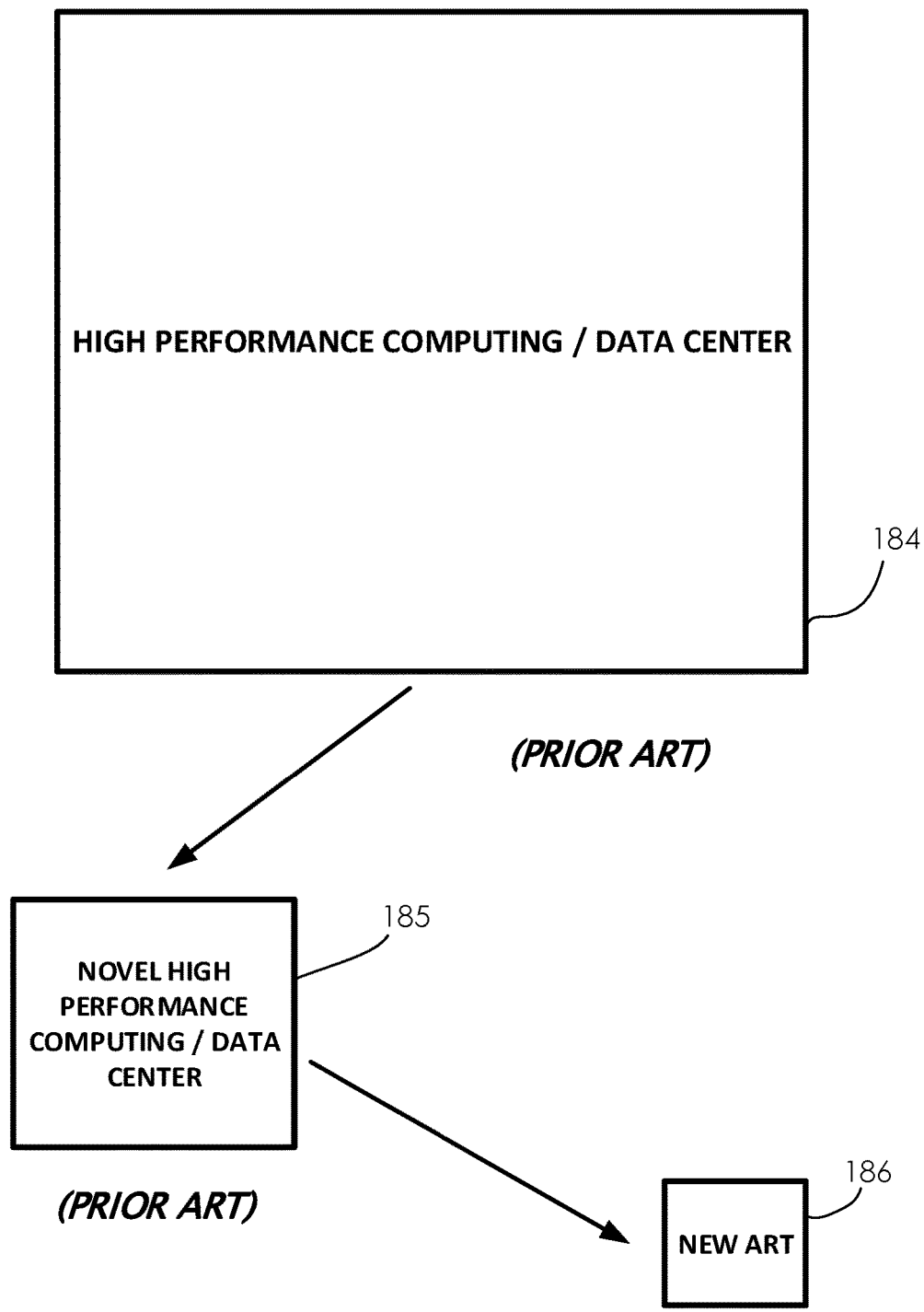
FIG. 12 block diagram of the shrinking in size of comparing a traditional high performance computing center in comparison to state of the art technologies coming into use and the comparison the new art of which is the present invention.

FIG. 12 illustrates the comparison of a high performance computing center 184 area in space in comparison to a novel high performance computing center 185 which is smaller in area due to use of state of the art technologies and process. At the bottom of the illustration in FIG. 12 is the new art 186 as is in this invention an illustration of how much space in area is taken as most of the art in this invention is vertical in application.

Figure 13:
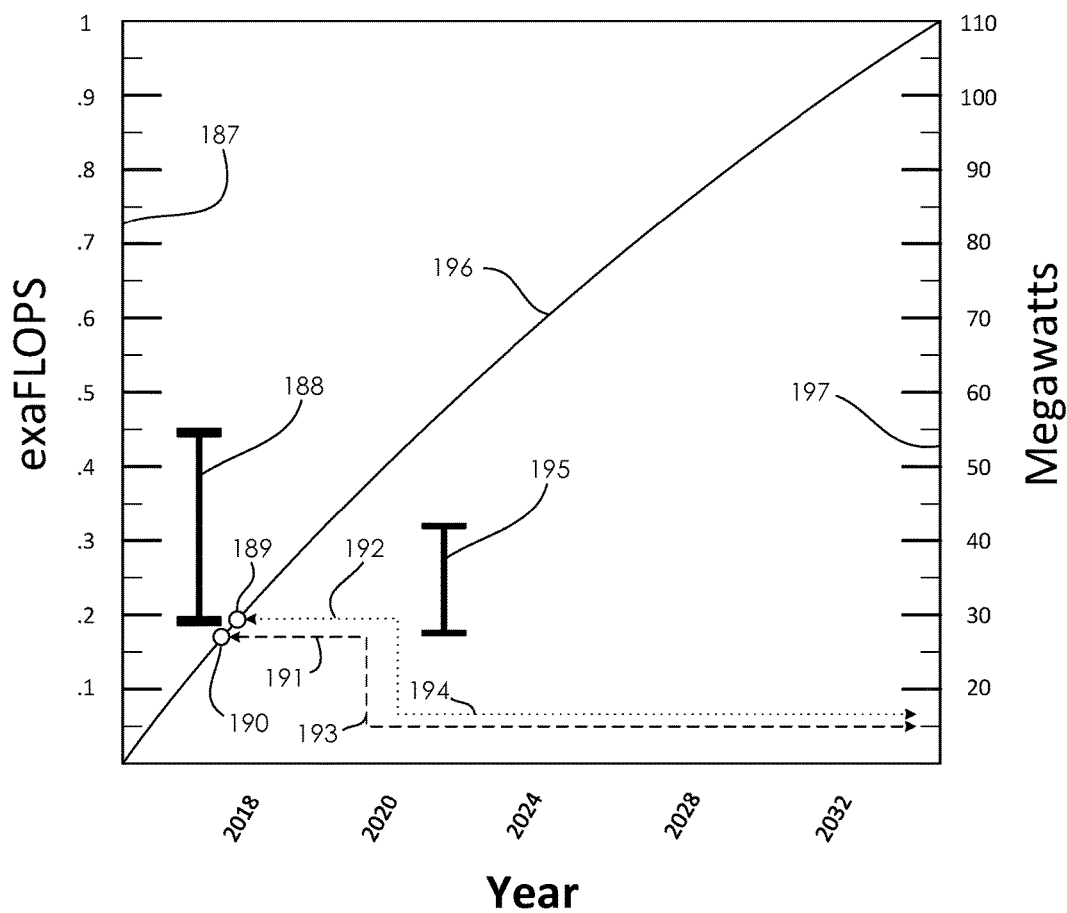
FIG. 13 is a chart depicting of upcoming US Government High Performance Computers expected performance parameters and electric power consumption.

FIG. 13 illustrates a chart depicting high performance computing measurements. Coming online are two United States Government high performance computers, the Aurora Supercomputer 189 and the Summit Supercomputer 190. On the left side of FIG. 13 is a linear of measurement referred to as floating-point performance. Measured in exaFLOPS 187, the Aurora Supercomputer 189 comes in at an Aurora peak system performance 188 with an Aurora baseline 192 at about 180 to 450 petaFLOPS with a Aurora power consumption 194 of about 13 Aurora megawatts 197. As per the Summit Supercomputer 190 the Summit peak system performance 195 that comes in with a Summit baseline 191 of at about 150 to 300 petaFLOPS with a Summit power consumption 193 of about 10 Summit megawatts 197. As with both supercomputers a linear performance line 196 is evident that in coming years' higher performance is coming online, as well as power consumption in megawatts 197 is evidently increasing.

Figure 14:
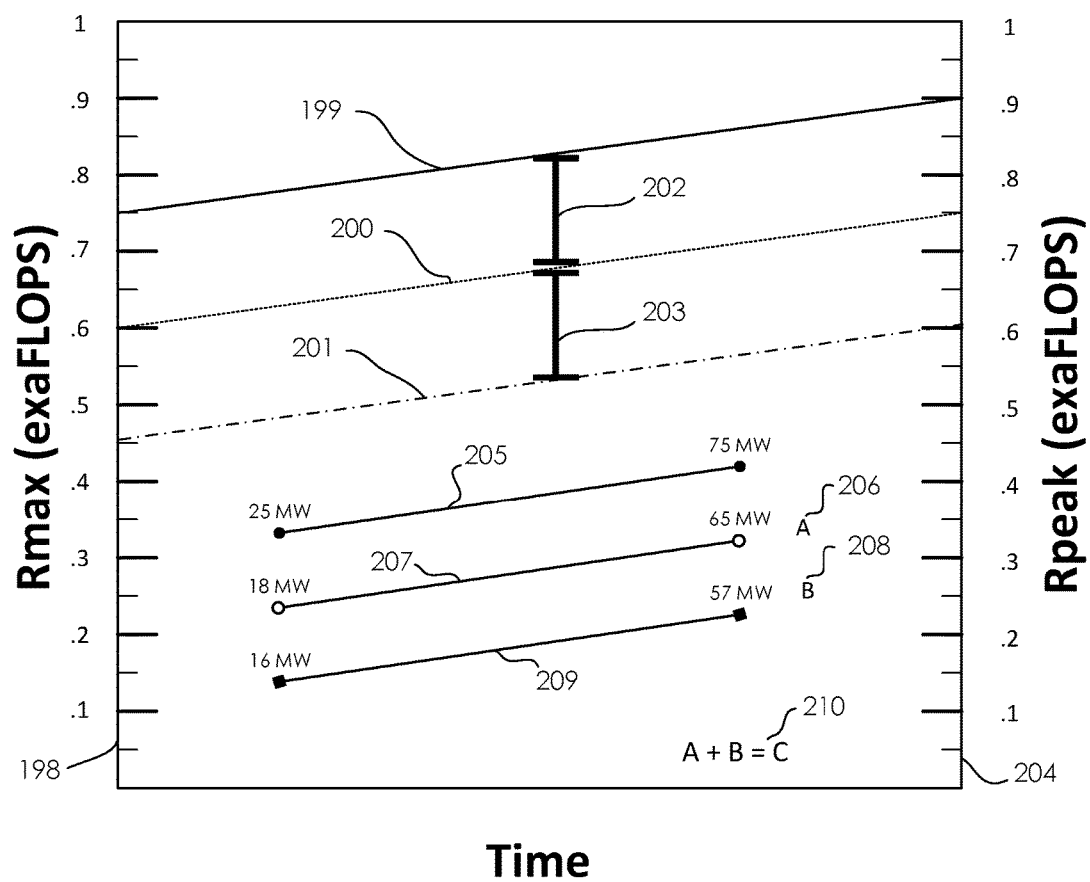
FIG. 14 is a chart depicting of theoretical and real world performance workloads.

In FIG. 14 illustrates a chart with time performance of supercomputers, and how they go hand in hand with typical performance, theoretical, and usual workload. On the left side of the chart shows the Rmax 198 value at the right side is the Rpeak 204 value. While the Rmax 198 is the typical operating performance over time for a supercomputer Rpeak 204 is theoretical ability of a supercomputer to perform. Therefore, for any system the theoretical limit 199 is how much the supercomputer could perform, while the typical actual performance load 200 is much lower. Supercomputers have a daily typical load 201 which is dependent on the number of users and operations carried out. Therefore, for either data centers and supercomputers a theoretical differential load 202 is less typical then a differential workload 203 which is daily work carried out to system slow times. Eventually, with time the difference although continue to grow a wide difference between the Rmax 198 and the Rpeak 204 is evident. As with performance growth so will the power load 205 of both data centers and supercomputers. With the cooling effect 206 as a result of using the process of the cooling by the invention will allow a power result 207. The power result 207 is the result of the amount of incoming electrical power not use into the system in lieu of the cooling effect 206. At times the system heat will allow to produce electrical power 160 therefore with power management 208 the power total 209 would equal over time the cooling effect 206 plus the power management 208 as shown in the formula 210.

The invention includes a thermal energy accumulator 211, which interconnects sources of heat energy producing sources of the invention and foreign heat source. The purpose of the thermal energy accumulator 211 is to provide additional thermal energy from within the system and use the heat energy from foreign sources to have a continual source of cyclical movement of thermal energy in order to cool all electrical connected devices besides servers 100. The thermal energy accumulator 211 interconnects the primary lines of the various sources heat exchangers. To provide heat energy, the thermal energy accumulator 211 first must receive air 176 in the form of cold condensed compressed air 149. By providing work either by electrical or mechanical means, each of the sources connected to the thermal energy accumulator 211 will in turn through their heat exchangers will in turn convert the cold condensed compressed air 149 to hot condensed compressed air 118.

After the cold condensed compressed air 149 passes through the thermal energy converter 150 or the third valve vent 158 and the fourth valve vent 159 on its way to the air basement 165, some of the cold condensed compressed air 149 passes through the cold air main 148 onto the thermal energy accumulator 211 from the cold air main valve vent 212. From the cold air main valve vent 212 the cold condensed compressed air 149 passes through the distribution manifold 213, which then sends the cold condensed compressed air 149 through the various sources.

Figure 15A:
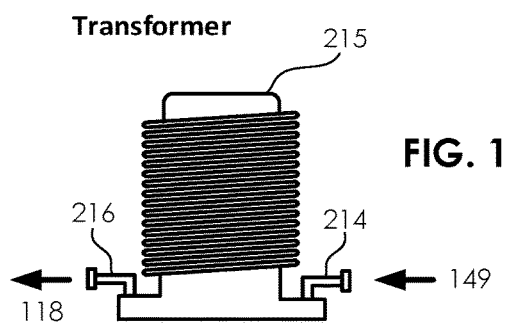
FIG. 15a is a front view of a transformer, which is one of the components of a thermal energy accumulator.

In FIG. 15a, the cold condensed compressed air 149 passes through a transformer 215, which receives the cold condensed compressed air 149 through the transformer heat exchange inlet 214 and which also serves as an on and off switch. A working transformer always produces heat energy, therefore the cold condensed compressed air 149 passing through the transformer 215 will turn to hot condensed compressed air 118 through thermal radiation effect. The hot condensed compressed air 118 then passes out of the transformer 215 through the transformer outlet heat exchanger 216, which also serves as a second on and off switch.

Figure 15B:
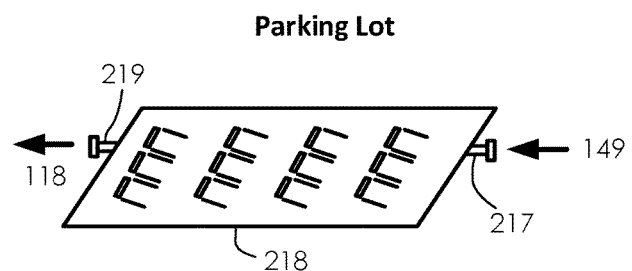
FIG. 15b is a perspective view of a parking lot, which is one of the components of a thermal energy accumulator.
Figure 16:
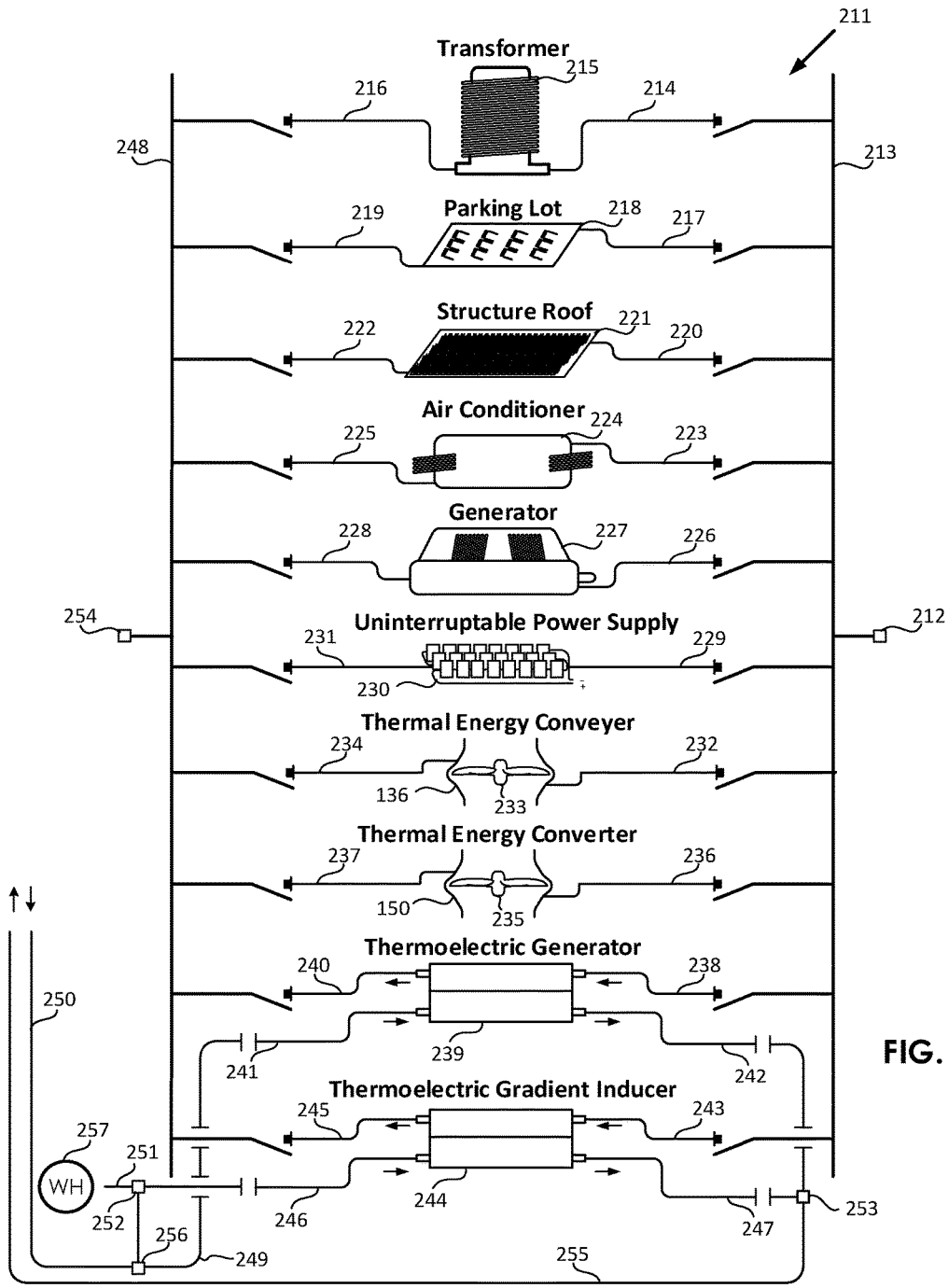
FIG. 16 is a schematic diagram of a plurality of thermal energy sources in parallel, which contribute to a thermal energy accumulator.

With reference to FIGS. 15b and 16, a parking lot 218 is also a part of the thermal energy accumulator 211, since depending on climatic location and seasonal time, the parking lot 218 receives intense solar radiation causing the pavement to accumulate heat energy. Therefore, the parking lot 218 receives cold condensed compressed air 149 through the parking lot heat exchanger inlet 217, which also serves as an on and off switch. The parking lot 218 will in turn provide heat energy through thermal radiation effect. Therefore the cold condensed compressed air 149 passing below the parking lot 218 pavement will in turn convert to hot condensed compressed air 118, which then passes out through the parking lot heat exchanger outlet 219 and which also serves as a second on and off switch.

Figure 15C:
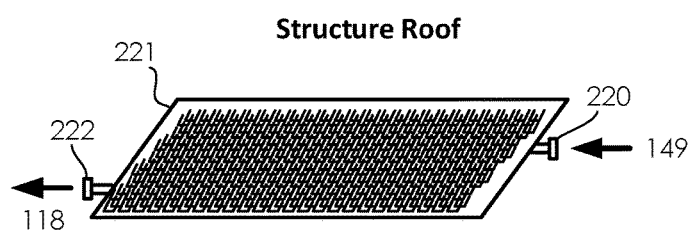
FIG. 15c is a perspective view of a building roof, which is one of the components of a thermal energy accumulator.

Even with a small footprint in FIG. 15c, the structure roof 221 of the high performance computing center receives solar radiation, which culminates into heat energy. A structure roof heat exchanger inlet 220 also serves as an on and off switch. Thus, the structure roof heat exchanger inlet 220 receives cold condensed compressed air 149, which in turn passes the cold condensed compressed air 149 through a plurality of restrictive air ducts. As the cold condensed compressed air 149 passes through the plurality of restrictive air ducts, the cold condensed compressed air 149 will turn to hot condensed compressed air 118 by heat energy radiation. The hot condensed compressed air 118 passes out of the structure roof 221 through the structure roof heat exchanger outlet 222 and which also serves as a second on and off switch.

Figure 15D:
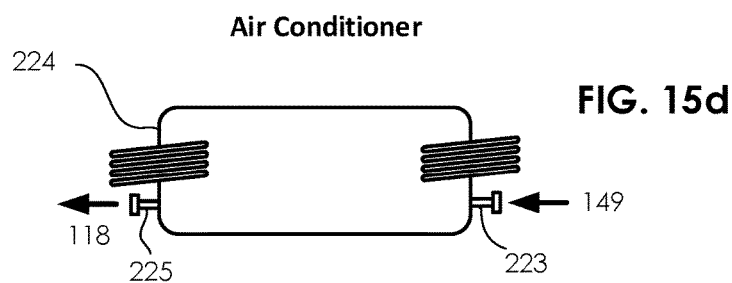
FIG. 15d is a schematic diagram of an air conditioner, which is one of the components of a thermal energy accumulator.

In FIG. 15*d*, an air conditioner 224 system is also a part of the thermal energy accumulator 211. The basic operation of an air conditioning system is to transfer heat. The air conditioner 224 includes a condenser whereby an air conditioner heat exchanger inlet 223 also serves as an on and off switch, which receives the cold condensed compressed air 149. At the point of location, the air conditioner heat exchanger inlet 223 transfers thermal energy between itself and the condenser of the air conditioner 224. As thermal energy is exchanged, the air is converted from cold condensed compressed air 149 to hot condensed compressed air 118. The hot condensed compressed air 118 therefore exits the air conditioner 224 through the air conditioner heat exchanger outlet 225, which also serves as a second on and off switch.

Figure 15E:
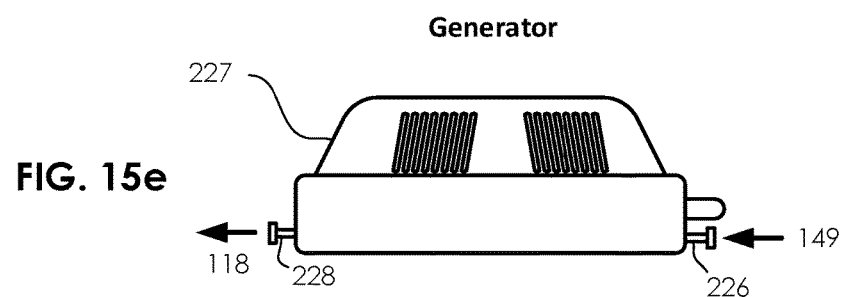
FIG. 15e is a schematic diagram of a generator, which is one of the components of a thermal energy accumulator.

In FIG. 15*e*, a generator 227 is also a part of the thermal energy accumulator 211. The generator 227 when put into service provides a compound source of heat energy, as the electrical generator itself, and the engine (not shown), which provides the mechanical force to the electrical generator. As with the other sources of heat energy, the generator 227 provides a duo radiator set for both the electrical generator 227 and the engine. The incoming cold condensed compressed air 149 goes in through the generator heat exchanger inlet 226 which also serves as an on and off switch. The generator heat exchanger inlet is provided with heat energy from the two radiators, one from the electrical generator 227, the other through the mechanical engine. As the cold condensed compressed air 149 passes through the radiators, a transference of thermal energy is made into the cold condensed compressed air 149, through a radiation effect. The cold condensed compressed air 149 is converted to hot condensed compressed air 118, which then passes out of the generator heat exchanger outlet 228. The generator heat exchanger outlet 228 also serves as a second on and off switch.

Figure 15F:
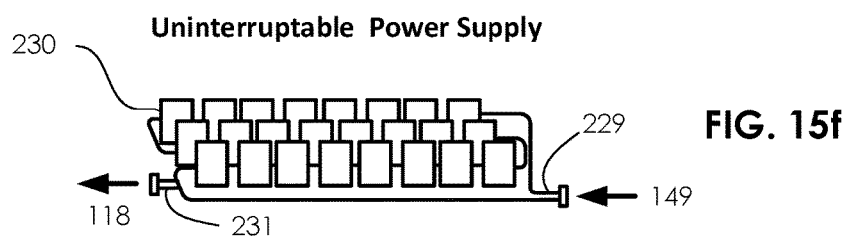
FIG. 15f is a schematic diagram of a uninterruptable power supply.

In FIG. 15*f*, an uninterruptable power supply 230 also connects to the distribution manifold 213 of which lets the cold condensed compressed air 149 pass through the uninterruptable power supply heat exchanger inlet 229 which also serves as an on and off switch. As a producer of heat energy, the uninterruptable power supply 230 is cooled by the cold condensed compressed air 149 passing through the uninterruptable power supply heat exchanger inlet 229. A transference of thermal energy is made into the cold condensed compressed air 149, which is converted into hot condensed compressed air 118. The hot condensed compressed air 118 exits the uninterruptable power supply heat through an exchanger outlet 231, which also serves as a second on and off switch.

In FIG. 15*g*, a thermal energy conveyer 136 includes a thermal energy conveyer motor 233, which is a conveyer of heat energy. A heat exchanger inlet 232 of a thermal energy conveyer motor 233 also serves as an on and off switch, which allows cold condensed compressed air 149 through the thermal energy conveyer motor 233. When put to work, the thermal energy conveyer motor 233 transfers heat energy to the cold condensed compressed air 149 thereby converting it into hot condensed compressed air 118. The thermal energy conveyer motor 233 produces heat of which extracting heat and expelling the hot condensed compressed air 118 prevents the thermal energy conveyor motor 233 from overheating. Therefore, the hot condensed compressed air 118 exits out through the thermal a heat exchanger outlet 234, which also serves as a second on and off switch.

In FIG. 15*h*, the thermal energy converter 150 also makes use of the cold condensed compressed air 149. The thermal energy converter generator 235 is prevented from overheating by letting the cold condensed compressed air 149 pass through a thermal energy converter generator heat exchanger inlet 236 which also serves as an on and off switch. Thermal relief to the thermal energy converter generator 235 keeps operating efficiency high and prevents breakdowns in operation. As the thermal energy converter generator 235 releases heat energy into the cold condensed compressed air 149, conversion to hot condensed compressed air 118 inevitably takes effect. With the content of thermal energy, the hot condensed compressed air 118 releases out through a thermal energy converter outlet 237, which also serves as a second on and off switch.

Figure 15I:
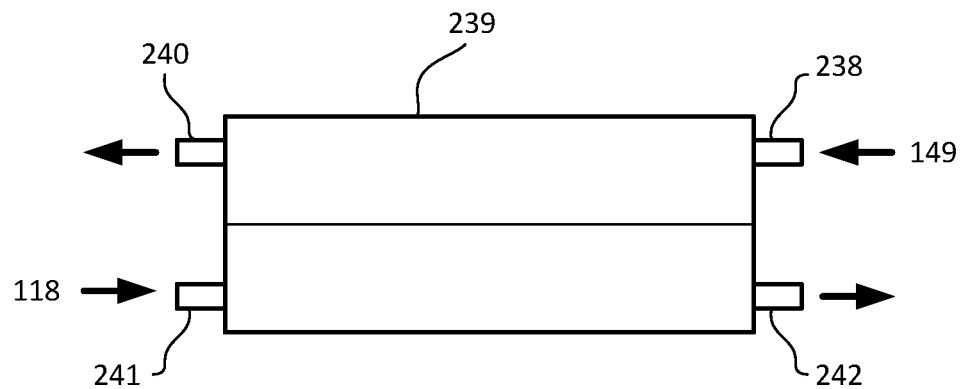
FIG. 15i is a schematic diagram of a thermoelectric generator.

In FIG. 15*i*, a thermoelectric generator 239, which works differently than the other sources of thermal energy. The purpose of the thermoelectric generator 239 is to make use of very cold temperatures and very hot temperatures, thereby employing thermoelectric theory. The thermoelectric generator 239 works under the principle of having two temperature differences. Semiconductor modified circuit plates produce electrical power to conduct under the temperature differences. The principle concept behind the invention is the use of temperature differences to produce electricity, therefore a thermoelectric generator 239 is a working source of added electrical power into the system. With simple chambers inside the thermoelectric generator 239, cold condensed compressed air 149 goes in through a thermoelectric generator cold inlet 238 which also serves as an on and off switch. The cold compressed air 149 exits through a thermoelectric generator cold outlet 240, which also serves as a second on and off switch. The hot condensed compressed air 118 comes in through a thermoelectric generator thermal energy inlet 241. With reference to FIGS. 4, 7, 16, the hot condensed compressed air 118 comes from the thermal line 128 by way of the thermal line main 250 to a thermoelectric generator main 249 of which also allows waste heat 257 from a waste heat line 251 through a waste heat valve 252 and the waste heat 257 flows through the thermoelectric generator main valve 256. A thermoelectric generator thermal energy outlet 242 resends the less thermally energetic hot condensed compressed air 118 back to the thermal line 128 by way of the excess waste heat main 255 and through the waste heat exit valve 253.

Figure 15J:
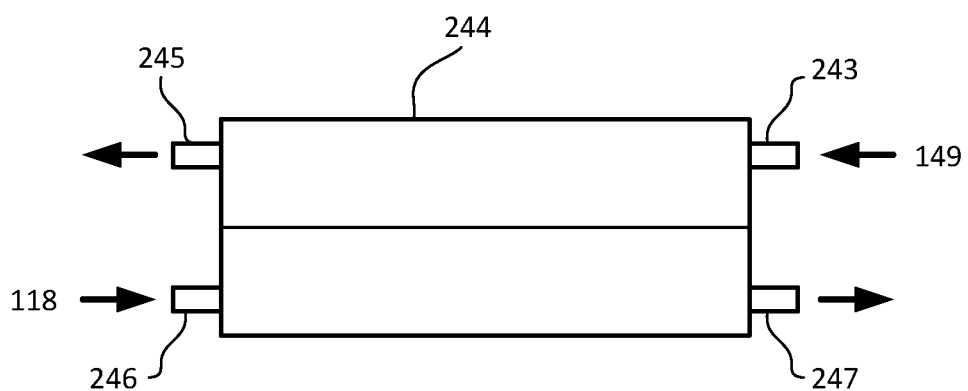
FIG. 15j is a schematic diagram of a thermoelectric gradient inducer.

In FIG. 15*j*, a thermoelectric gradient inducer 244 allows cold condensed compressed air 149 to enter through a thermoelectric gradient inducer cold inlet 243 which also serves as an on and off switch. The cold condensed compressed air 149 exits through a thermoelectric gradient inducer cold outlet 245 which also serves as a second on and off switch. At the opposing side of the thermoelectric gradient inducer 244, hot condensed compressed air 118 enters through a thermoelectric gradient inducer thermal energy inlet 246 then passes out a thermoelectric gradient inducer thermal energy outlet 247. With reference to FIGS. 4, 7, 16, at the same time waste heat 257 is introduced from foreign sources outside the present invention through the waste heat line 251 directly into the thermoelectric gradient inducer thermal energy inlet 246. The thermoelectric gradient inducer thermal energy inlet 246 is connected to the waste heat valve 252. The waste heat valve 252 redirects thermal energy to the thermal line main 250 through the thermoelectric generator main valve 256 or to the thermoelectric generator 239 through the thermoelectric generator main 249. Less energetic hot condensed compressed air 118 exits the thermoelectric gradient inducer thermal energy outlet 247 and goes back to the thermal line 128 through a waste heat exit valve 253 and the excess waste heat main 255. In addition, less energetic hot condensed compressed air 118 exits the thermoelectric generator thermal energy outlet 242 and goes back to the thermal line 128 through the waste heat exit valve 253 and the excess waste heat main 255.

Most of the sources of heat energy that make up part of the thermal energy accumulator 211 are shown in FIG. 16. FIG. 16 shows how the cold condensed compressed air 149 is introduced simultaneously to the various sources of heat energy producers by the distribution manifold 213. The distribution manifold 213 distributes cold condensed compressed air 149 from the cold air main valve vent 212. Commonly connected via the distribution manifold 213, the transformer 215, the parking lot 218, and the structure roof 221 are displayed. The air conditioner 224, the generator 227, and the uninterruptable power supply 230 are also connected to the distribution manifold 213. In addition, the thermal energy conveyer motor 233, and the thermal energy converter generator 235 connects to the distribution manifold. The thermoelectric generator 239 and the thermoelectric gradient inducer 244 are connected to the distribution manifold 213. The thermoelectric generator 239 and the thermoelectric gradient inducer 244 are not sources of heat energy, but rather produce electricity from thermodynamic imbalance of thermal energy in the system. Therefore, the thermoelectric generator 239 and the thermoelectric gradient inducer 244 take advantage of using heat energy from the thermal line 128 and foreign sources through the waste heat line 251. Therefore, outlets 240, 245 of the above thermoelectric devices 239, 244 connect to the thermal line 128 through the convergence valve 254 via an outlet convergence reverse manifold 248.

Figure 17:
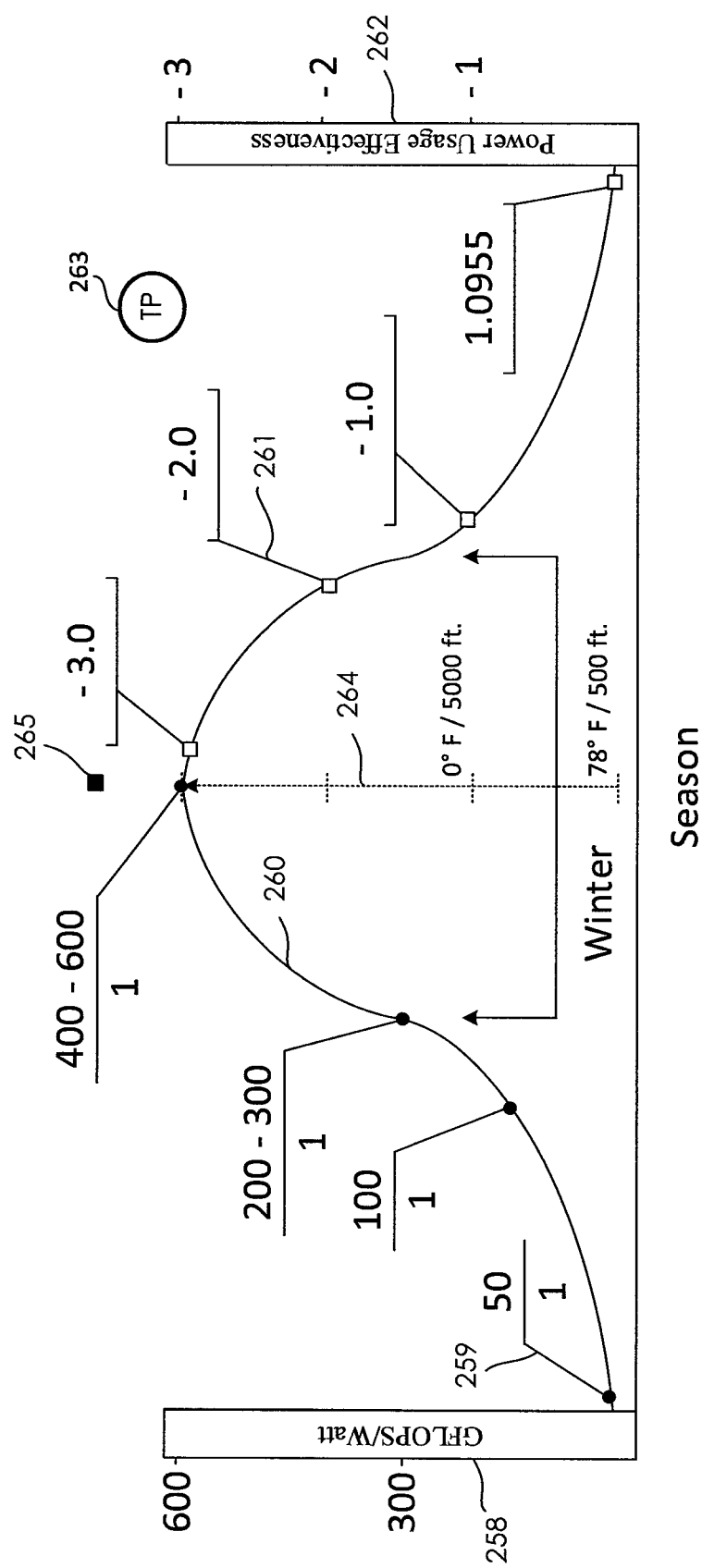
FIG. 17 is a chart depicting performance ratios for high performance computing, and power usage effectiveness inverse performance for data centers.
Figure 1:
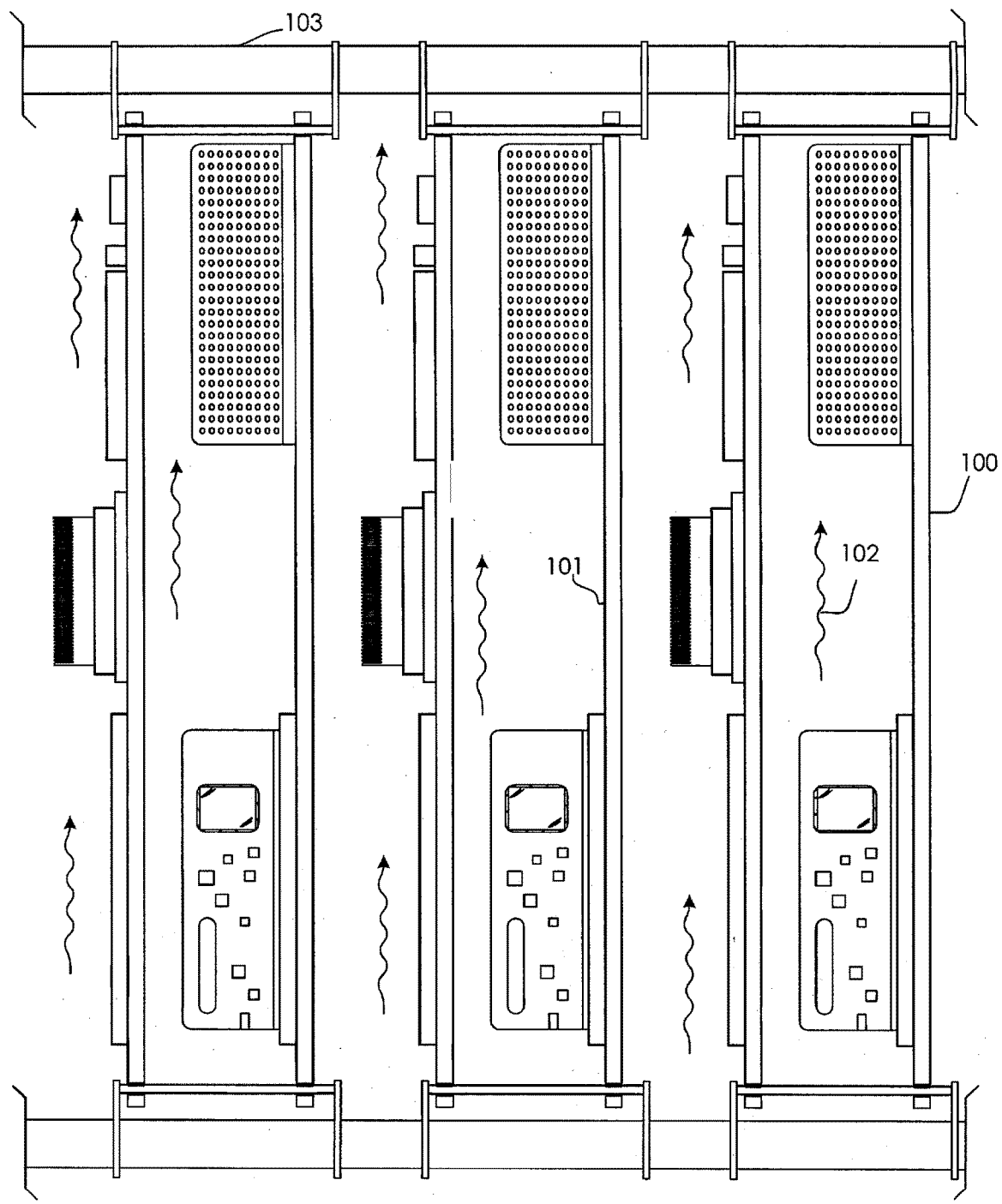

FIG. 17 is the performance ratios summary chart depicting of Floating-Points Performance per Second for High Performance Computing and the Power Usage Effectiveness for Data Centers. The performance of the present invention effectiveness increases with elevation and the location of the heat exchanger 140 in addition to seasons of the year. Obviously, the higher the latitude of the present invention to the Arctic Circle the higher the efficiency, although due to power requirements of computing centers, limited transmission networks exist proximity to the Arctic Circle. In the lower 48 states, the United States of America holds the most efficient electrical power generation and transmission networks. In conjunction with mountainous regions, these include the Appalachian Mountains, the Rocky Mountains, the Allegheny Mountains, and the Sierra Nev. Mountains experience the four seasons of the year, specifically winter.

In FIG. 17, the effectiveness of the present invention reaches its highest during the season of winter. At the left of the chart is the performance per watt input per unit of time, the measurement is the GFLOPS/Watt performance per watt scale 258, read gigaFLOPs per one Watt or a billion floating points of operation a second per unit of one watt. On the left side of the performance cure 260 is the performance ratio 259.

The performance per watt scale 258 measured, at the first performance ratio 259 is equal to fifty billion floating points of operation per baseline watt. Therefore 50 GFLOPS/Watt were attributed for an actual input of one watt. The rest of the power attributed to the 50 GFLOPS/Watt came from the thermal energy converter 136, the thermoelectric generator 239, and the thermoelectric gradient inducer 244, plus energy not used in lieu of artificial cooling for the 50 GFLOPS/Watt result. The numerator in billions is the floating-point operations per second, the denominator is the unit of watt. Therefore the performance curve 260 shows a performance ratio 259 of 50 GFLOPS/Watt, a 100 GFLOPS/Watt, another 200-300 GFLOPS/Watt, and a 400-600 GFLOPS/Watt at its pinnacle of performance during the middle of winter. The middle of winter in the lower 48 states of the United States of America is the winter solstice 265, although temperature fluctuates during winter. At the right side of the performance curve 260 is the power usage effectiveness scale 262 measurement for data centers. The power usage effectiveness inverse performance 261 is the inverse of total electric power output 263 over the power use only for information technology equipment. The power usage effectiveness inverse performance 261 depiction on the performance curve 260 of over negative −1.0 is evident, the amount of waste heat 257 energy, plus the amount of electric power 160 produced by the thermoelectric generator 239, in addition to the electric power 160 produced by the thermoelectric gradient inducer 244, and the thermal energy converter 150 is greater than the amount of electric power 160 for information technology and related equipment. The power usage effectiveness inverse performance 261 is greater with lower temperatures and higher elevations, especially during winter as expressed in the temperature and elevation scale 264. Therefore, of the four measurements on the power usage effectiveness scale 262, three are inverse or negative. Power usage effectiveness inverse performance 261 of −1.0 PUE measurement, −2.0 PUE measurement, and −3.0 PUE measurement, are measure in ratios, hence −1.0 PUE measurement is equal to 2 watts output to 1 watt input to information technology equipment and related, thus 2 watts output minus 1 watt use, results in 1 watt extra, hence a power usage effectiveness inverse performance 261 of negative one. The performance curve 260 also depicts two other power usage effectiveness inverse performance values of −2.0 power usage effectiveness 262 and −3.0 power usage effectiveness 262.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A method of generating electrical power, comprising the steps of:
   providing a source of cold compressed air;
   providing a heat exchanger;
   providing a cold air main, wherein the cold compressed air moves downward from said heat exchanger through said cold air main;
   providing at least one object that generates heat, each one of said at least one object includes an inlet for receiving said cold compressed air, mixing said cold compressed air received through said inlet with heat from said at least one object to form modified hot compressed air, said modified hot compressed air exits said at least one object through an outlet, said heat exchanger is located at an elevation above said at least one object, such that said cold compressed air moves downward from said heat exchanger; and providing at least one electrical power generating device, each one of said at least one electrical power generating device includes an inlet for receiving said cold compressed air and an inlet for receiving said modified hot compressed air, each one of said at least one electrical power generating device includes an outlet for said cold compressed air and an outlet for said modified hot compressed air, a temperature difference between said source of cold compressed air and said modified hot compressed air is sufficient for said at least one electrical power generating device to operate, wherein electrical power is generated from a temperature difference between said cold compressed air and said modified hot compressed air; and providing a cold air main valve connected to the cold air main that distributes the cold compressed air to the at least one object and the at least one electrical power generating device through a thermal line connected between the at least one object and the at least one electrical power generating device.

2. The method of generating electrical power of claim 1, further comprising the step of:
said at least one object being a transformer, a parking lot, a roof structure, an air conditioner, a generator, an uninterruptible power supply, a motor of a thermal energy conveyer and a motor of a thermal energy converter.

3. The method of generating electrical power of claim 1, further comprising the step of:
said at least one electrical power generating device being one of a thermoelectric generator and a thermoelectric gradient inducer.

4. A method of generating electrical power, comprising the steps of:
providing a source of cold compressed air;
providing a heat exchanger;
providing a cold air main, wherein the cold compressed air moves downward from said heat exchanger through said cold air main;
providing at least one object that generates heat, each one of said at least one object includes an inlet for receiving said cold compressed air, mixing said cold compressed air received through said inlet with heat from said at least one object to form modified hot compressed air, said modified hot compressed air exits said at least one object through an outlet, said heat exchanger is located at an elevation above said at least one object, such that said cold compressed air moves downward from said heat exchanger;
providing at least two electrical power generating devices, said at least two electrical power generating devices are arraigned in parallel, each one of said at least two electrical power generating devices includes an inlet for receiving said cold compressed air and an inlet for receiving said modified hot compressed air, each one of said at least two electrical power generating devices includes an outlet for said cold compressed air and an outlet for said modified hot compressed air, a temperature difference between said source of cold air and said modified hot compressed air is sufficient for said at least two electrical power generating devices to operate, wherein electrical power is generated from a temperature difference between said cold compressed air and said modified hot compressed air; and providing a cold air main valve connected to the cold air main that distributes the cold compressed air to the at least one object and the at least two electrical power generating devices through a thermal line connected between the at least one object and the at least two electrical power generating devices.

5. The method of generating electrical power of claim 4, further comprising the step of:
said at least one object being a transformer, a parking lot, a roof structure, an air conditioner, a generator, an uninterruptible power supply, a motor of a thermal energy conveyer and a motor of a thermal energy converter.

6. The method of generating electrical power of claim 4, further comprising the step of:
said at least two electrical power generating devices being a thermoelectric generator and a thermoelectric gradient inducer.

7. A method of generating electrical power, comprising the steps of:
providing a source of cold compressed air;
providing a heat exchanger;
providing a cold air main, wherein the cold compressed air moves downward from said heat exchanger through said cold air main;
providing at least two objects that generate heat, said at least two objects that generate heat are arraigned in parallel, each one of said at least two objects includes an inlet for receiving said cold compressed air, mixing said cold compressed air received through said inlet with heat from said at least two objects to form modified hot compressed air, said modified hot compressed air exits said at least two objects through an outlet, said heat exchanger is located at an elevation above said at least two objects, such that said cold compressed air moves downward from said heat exchanger; and providing at least one electrical power generating device, each one of said at least one electrical power generating device includes an inlet for receiving said cold compressed air and an inlet for receiving said modified hot compressed air, each one of said at least one electrical power generating device includes an outlet for said cold compressed air and an outlet for said modified hot compressed air, a temperature difference between said source of cold air and said modified hot compressed air is sufficient for said at least one electrical power generating device to operate, wherein electrical power is generated from a temperature difference between said cold compressed air and said modified hot compressed air; and providing a cold air main valve connected to the cold air main that distributes the cold compressed air to the at least two objects and the at least one electrical power generating device through a thermal line connected between the at least two objects and the at least one electrical power generating device.

8. The method of generating electrical power of claim 7, further comprising the step of:
said at least two objects being at least two of a transformer, a parking lot, a roof structure, an air conditioner, a generator, an uninterruptible power supply, a motor of a thermal energy conveyer and a motor of a thermal energy converter.

9. The method of generating electrical power of claim 7, further comprising the step of:

said at least one electrical power generating device being one of a thermoelectric generator and a thermoelectric gradient inducer.

10. The method of generating electrical power of claim 1, further comprising the step of:
locating said elevation at least 4,500 feet above said at least one object.

11. The method of generating electrical power of claim 4, further comprising the step of:
locating said elevation at least 4,500 feet above said at least one object.

12. The method of generating electrical power of claim 7, further comprising the step of:
locating said elevation at least 4,500 feet above said at least two objects.

* * * * *

UNITED STATES PATENT AND TRADEMARK OFFICE
CERTIFICATE OF CORRECTION

| | |
|---|---|
| PATENT NO. | : 10,020,436 B1 |
| APPLICATION NO. | : 15/623473 |
| DATED | : July 10, 2018 |
| INVENTOR(S) | : Matteo B. Gravina |

Page 1 of 2

It is certified that error appears in the above-identified patent and that said Letters Patent is hereby corrected as shown below:

In the Drawings

Please replace Drawing sheet 1 of 20 with attached Drawing sheet 1 of 20

Signed and Sealed this
Ninth Day of July, 2019

Andrei Iancu
*Director of the United States Patent and Trademark Office*